(12) United States Patent
Yamazaki et al.

(10) Patent No.: US 7,737,442 B2
(45) Date of Patent: Jun. 15, 2010

(54) SEMICONDUCTOR DEVICE

(75) Inventors: Shunpei Yamazaki, Setagaya (JP); Masayuki Sakakura, Isehara (JP); Aya Miyazaki, Yokohama (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 69 days.

(21) Appl. No.: 11/474,933

(22) Filed: Jun. 27, 2006

(65) Prior Publication Data

US 2006/0292865 A1    Dec. 28, 2006

(30) Foreign Application Priority Data

Jun. 28, 2005    (JP)    ............................. 2005-189020
Dec. 28, 2005    (JP)    ............................. 2005-379975

(51) Int. Cl.
*H01L 27/146*    (2006.01)

(52) U.S. Cl. .................. 257/59; 257/72; 257/E27.131; 349/43

(58) Field of Classification Search ................. 257/750, 257/E29.117, E29.119, E29.122, E29.273, 257/59, 72, E27.131; 349/43
See application file for complete search history.

(56) References Cited

U.S. PATENT DOCUMENTS

| | | | |
|---|---|---|---|
| 5,485,019 A * | 1/1996 | Yamazaki et al. ............. 257/57 |
| 5,990,555 A * | 11/1999 | Ohori et al. .................. 257/750 |
| 6,040,589 A | 3/2000 | Zhang et al. |
| 6,337,234 B2 * | 1/2002 | Ha et al. ...................... 438/161 |
| 6,356,330 B1 | 3/2002 | Ando et al. |
| 6,387,737 B1 | 5/2002 | Yamazaki et al. |
| 6,466,280 B1 | 10/2002 | Park et al. |
| 6,580,474 B1 | 6/2003 | Ahn et al. |
| 6,900,856 B2 | 5/2005 | Kim et al. |
| 6,992,364 B2 | 1/2006 | Yoo et al. |
| 2002/0025591 A1 | 2/2002 | Ohnuma et al. |
| 2004/0224241 A1 * | 11/2004 | Park et al. ....................... 430/5 |
| 2004/0245641 A1 | 12/2004 | Eguchi |

FOREIGN PATENT DOCUMENTS

| JP | 2002-252352 | 9/2002 |
|---|---|---|
| JP | 2004-296665 | 10/2004 |

* cited by examiner

*Primary Examiner*—Minh-Loan T Tran
*Assistant Examiner*—W. Wendy Kuo
(74) *Attorney, Agent, or Firm*—Eric J. Robinson; Robinson Intellectual Property Law Office, P.C.

(57) ABSTRACT

A semiconductor device of the present invention has a first conductive layer, a second conductive layer, an insulating layer which is formed between the first conductive layer and the second conductive layer and which has a contact hole, and a third conductive layer which is connected to the first conductive layer and the second conductive layer and of which at least a part of an end portion is formed inside the contact hole. Near a contact hole where the second conductive layer is connected to the third conductive layer, the third conductive layer does not overlap with the second conductive layer with the first insulating layer interposed therebetween and an end portion of the third conductive layer is not formed over the first insulating layer. This allows suppression of depression and projection of the third conductive layer.

6 Claims, 23 Drawing Sheets

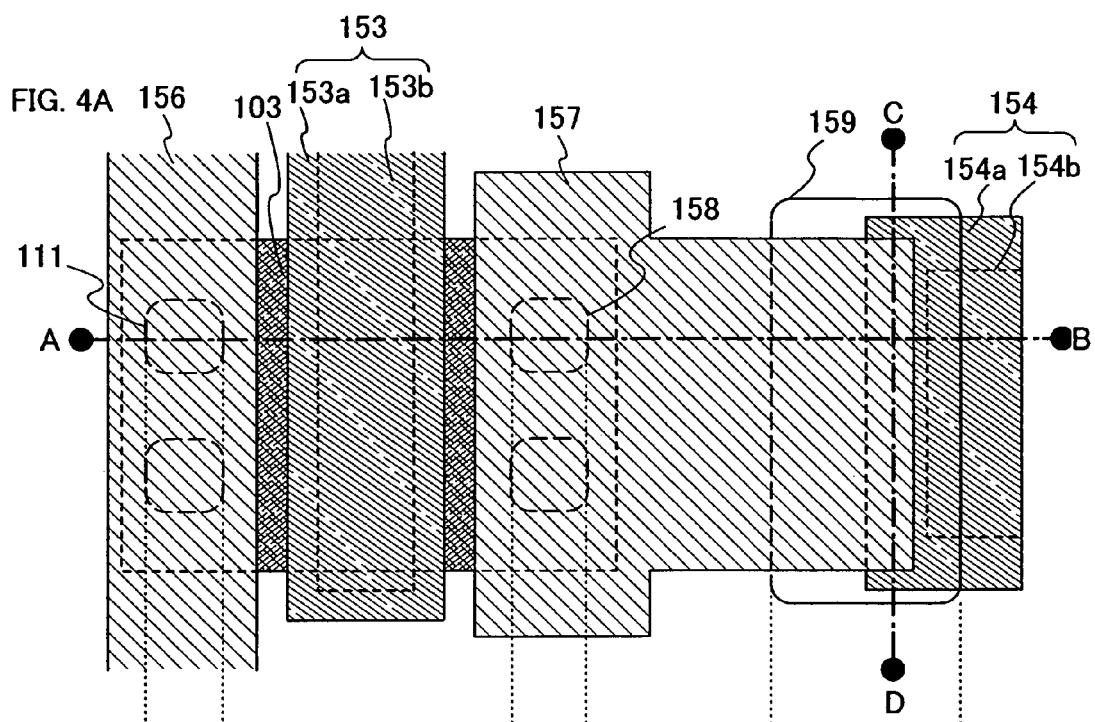
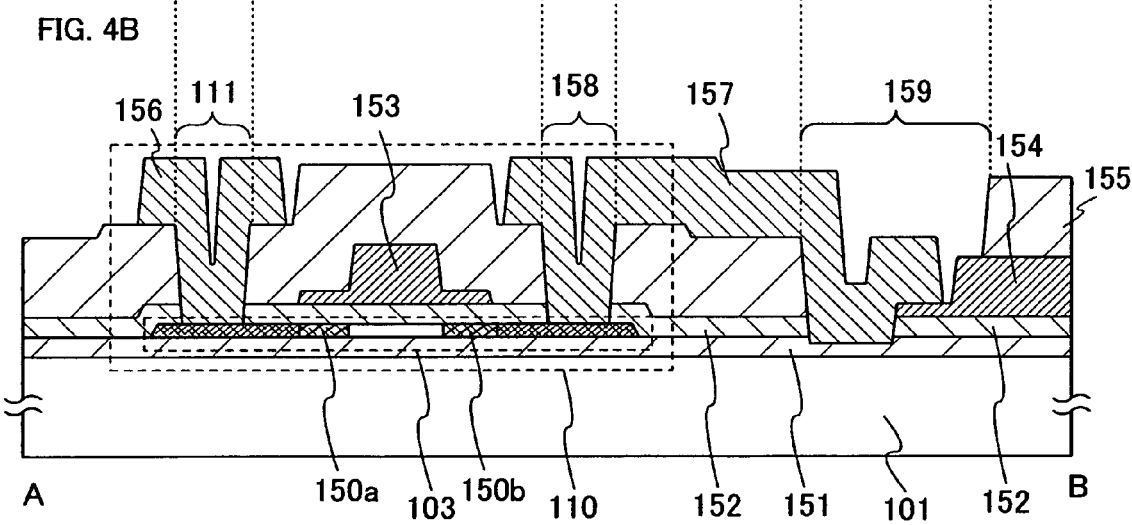
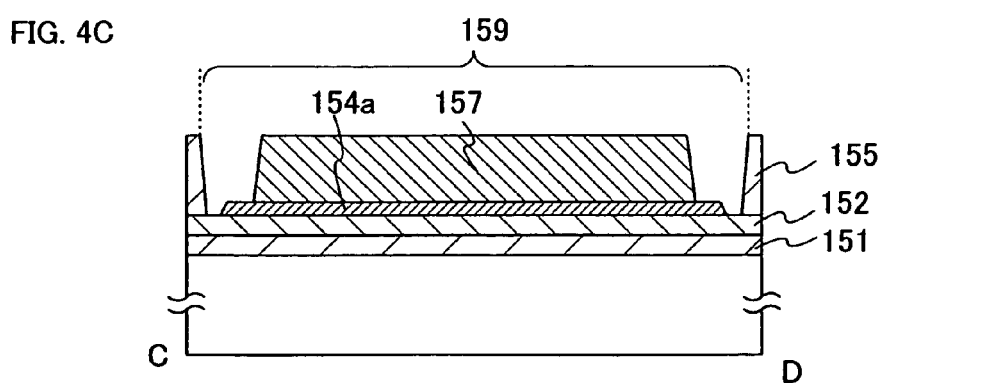

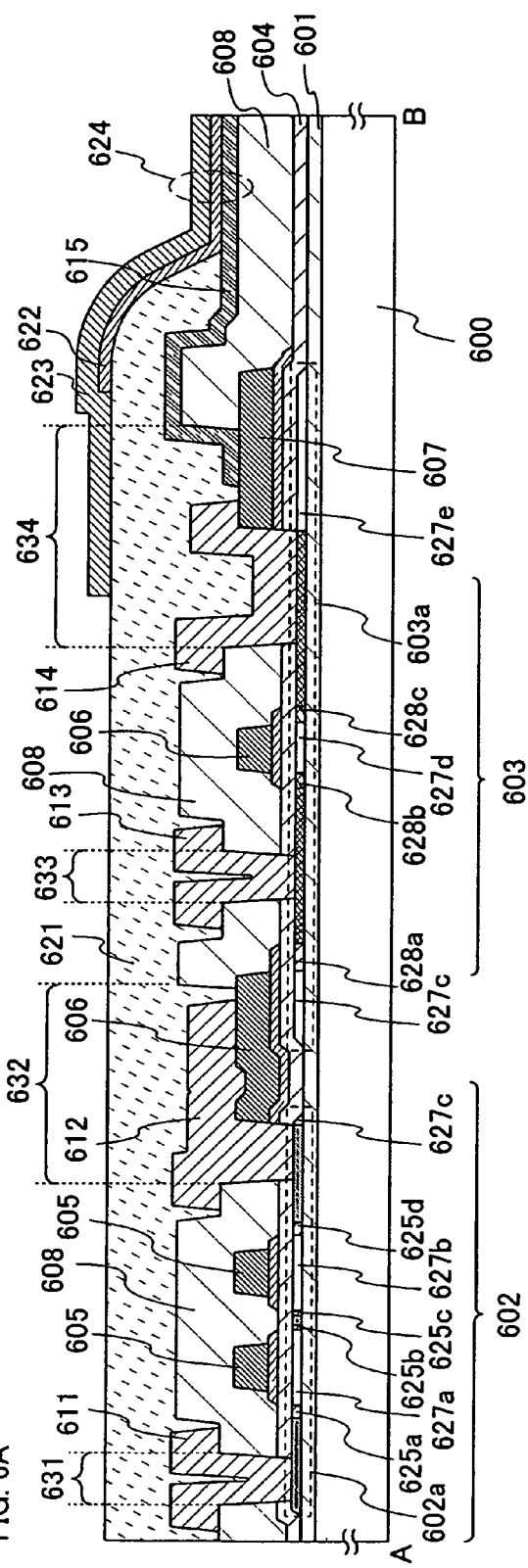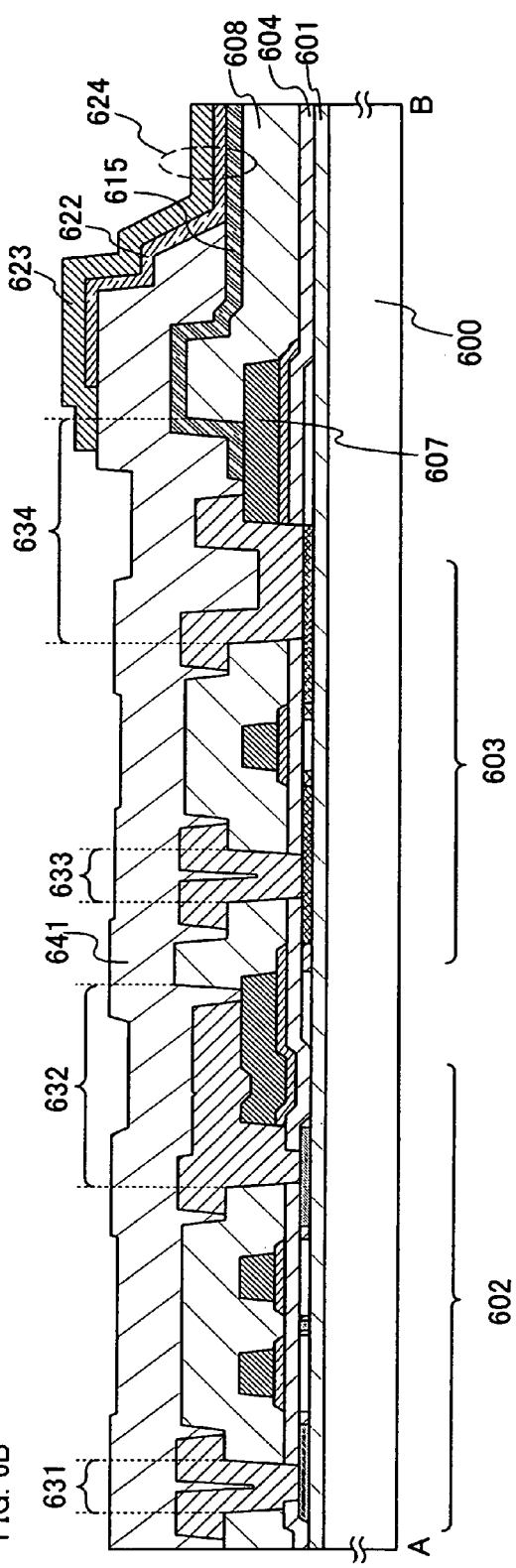

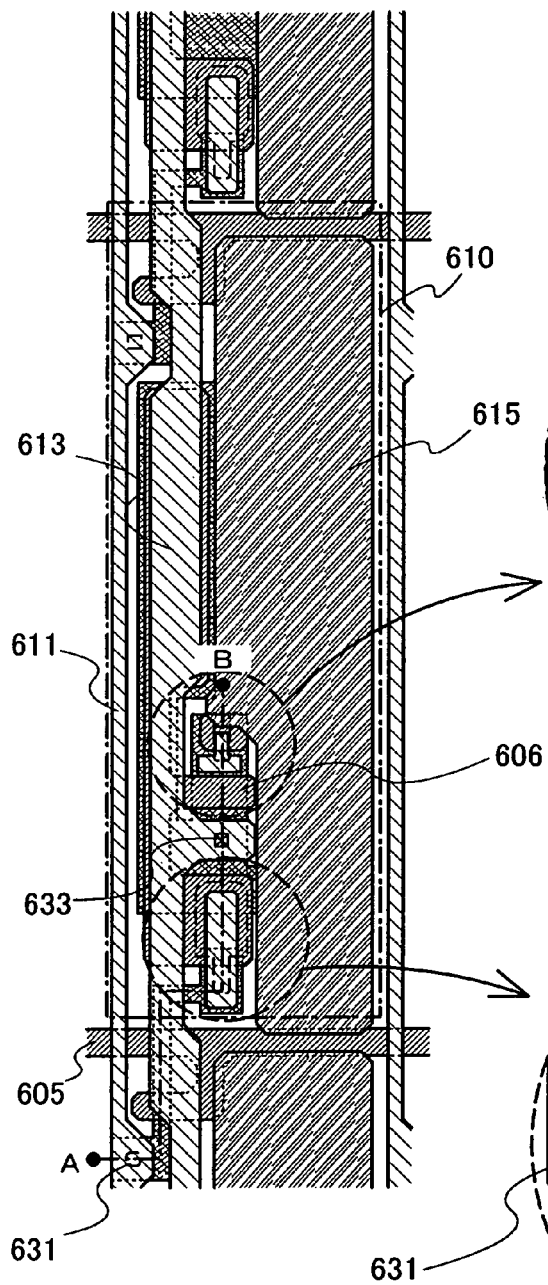
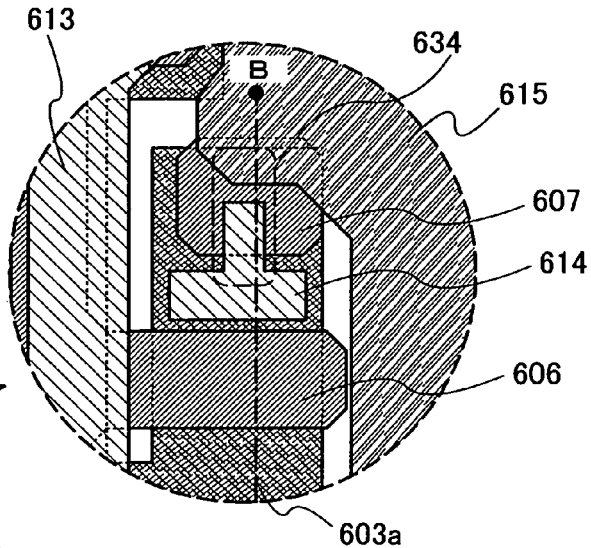
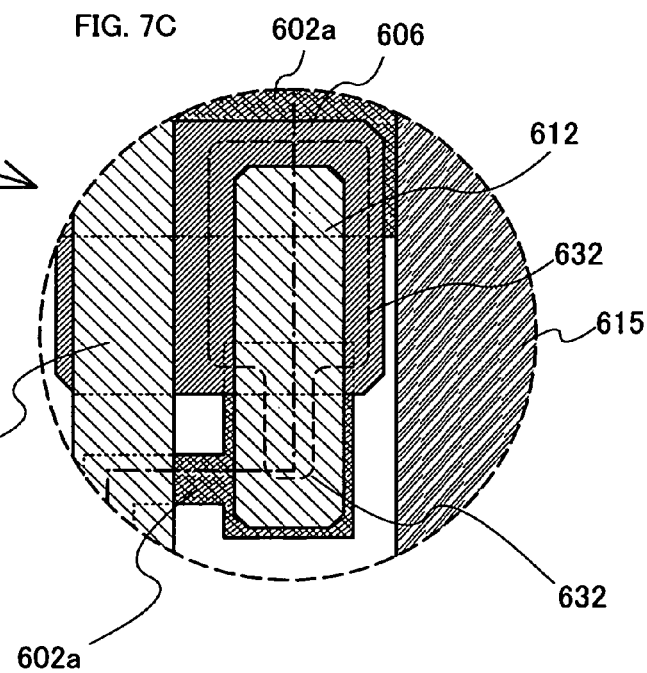
FIG. 7A
FIG. 7B
FIG. 7C

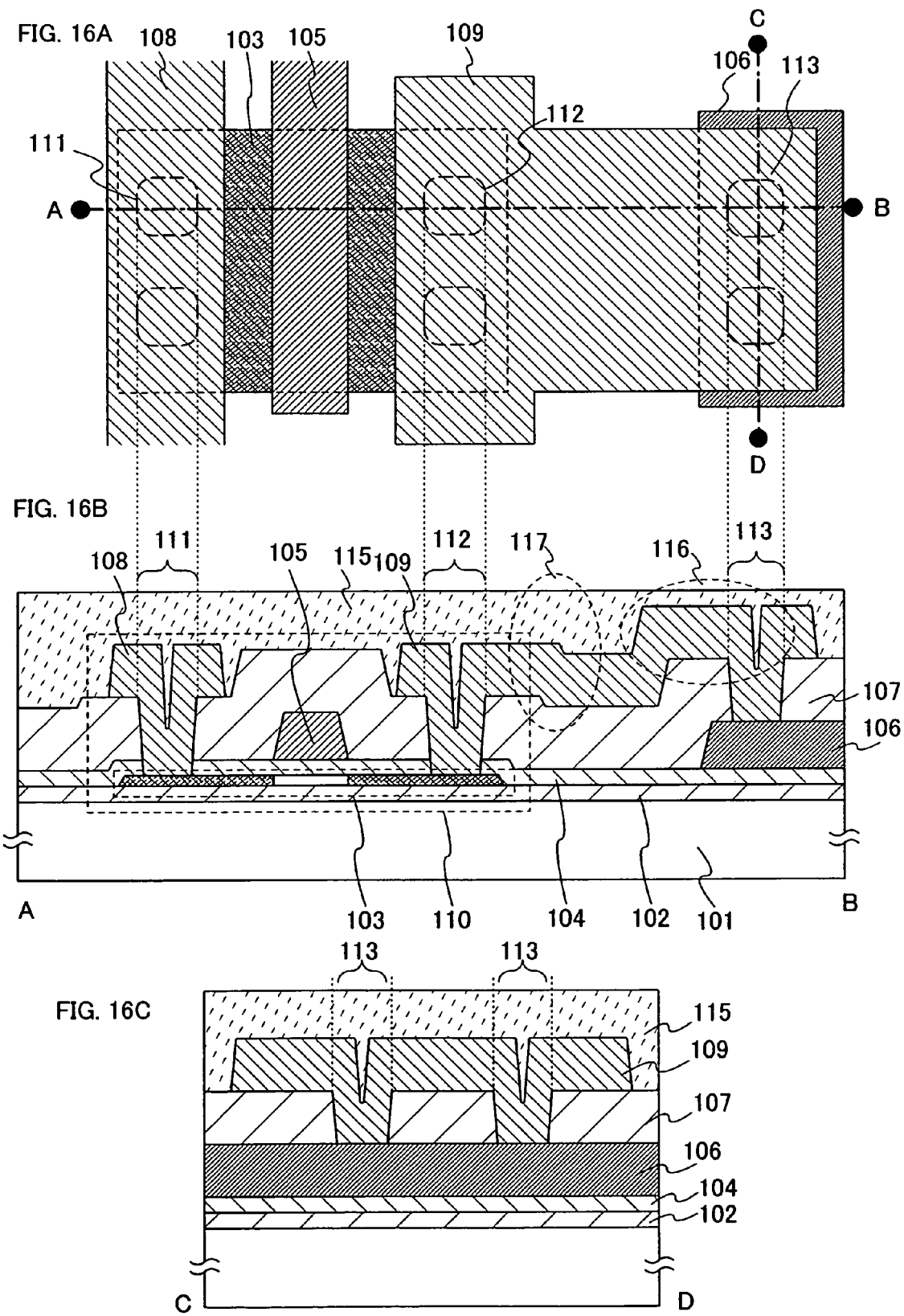

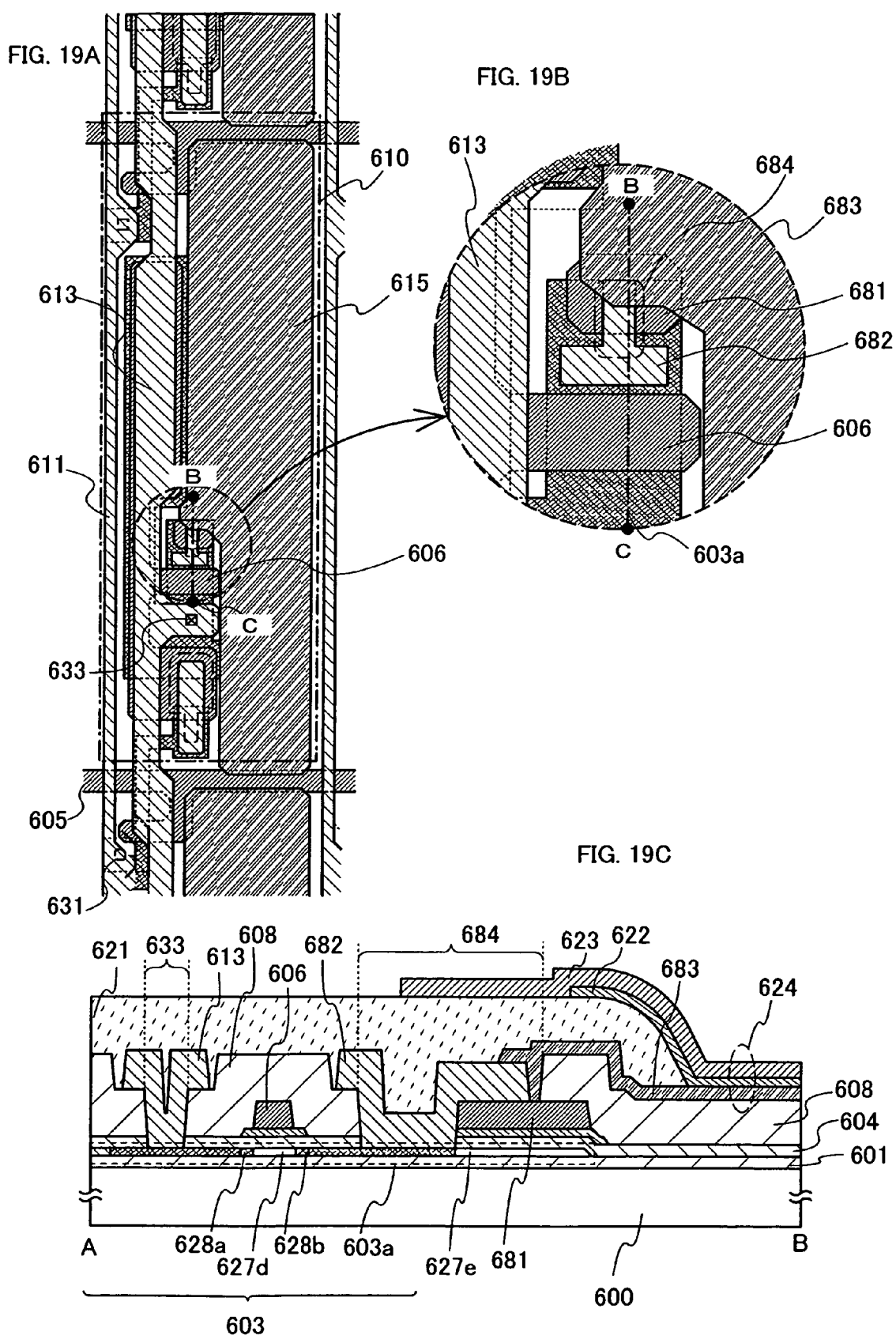

SEMICONDUCTOR DEVICE

BACKGROUND OF THE INVENTION

1. Field of Invention

The present invention relates to a semiconductor device in which wires are stacked.

2. Description of the Related Art

In recent years, the degree of integration of semiconductor elements increases for wiring substrates and semiconductor devices, and integration progresses further. This makes wire width narrower and increases the number of wires. Moreover, downsizing of an area of semiconductor devices is attempted by making the wiring into multi-wiring.

As a typical example of a semiconductor element that forms a semiconductor device, a thin film transistor is described with reference to FIGS. 16A to 16C. FIG. 16A is a top view of a thin film transistor and FIGS. 16B and 16C are cross-sectional views taken along lines A-B and C-D of FIG. 16A, respectively. In FIG. 16A, a substrate 101, insulating layers 102, 107, and 115, and a gate insulating layer 104 which are shown in FIGS. 16B and 16C are omitted.

As shown in FIG. 16B, in a thin film transistor 110, a semiconductor region 103 and a gate electrode 105 are insulated by the gate insulating layer 104 and the gate electrode 105 and wires 108 and 109 are insulated by the insulating layer 107. Moreover, a conductive layer 106 is formed at the same time as the gate electrode 105 over the gate insulating layer 104, and the conductive layer 106 and the wire 109 are insulated by the insulating layer 107 interposed therebetween.

Moreover, the wire 108 is connected to one of a source region and a drain region of the semiconductor region 103 through a contact hole 111 formed in the insulating layer 107. Moreover, the wire 109 is connected to the other of the source region and the drain region of the semiconductor region 103 through a contact hole 112 formed in the insulating layer 107. The wire 109 is connected to the conductive layer 106 through a contact hole 113 formed in the insulating layer 107.

Such a structure makes it possible to stack a semiconductor region, a gate electrode, a wire, and the like in a thin film transistor.

As shown in FIG. 16A, each of the wires 108 and 109 is formed so as to have a cross sectional area that is larger than an area of each of the contact holes 111 to 113. In the case of forming the insulating layer 107 by a thin-film formation method such as a CVD method or a sputtering method, a surface of the insulating layer 107 is not flattened and is affected by depression and projection of a layer serving as a base for the insulating layer 107. Thus, depression and projection increase on the surfaces of the wires 108 and 109 and the insulating layer 107, as shown in FIG. 16B.

In a liquid crystal display device, if an element for driving a pixel electrode is formed by using such a thin film transistor, depression and projection of the insulating layer cause an orientation film not to be rubbed uniformly. This causes problems in that orientation of liquid crystals is distorted and accordingly image quality is degraded. Therefore, the insulating layer 115 which has been flattened is formed over the insulating layer 107 and the wires 108 and 109.

As a method for forming the insulating layer 115, a method in which an insulating film formed by a CVD method or a PVD method is flattened by polishing by CMP or the like or a method in which an insulating layer having superior flatness is formed by a coating method is given.

In the case of forming the insulating layer 115 having superior flatness by a coating method, the insulating layer 115 is formed in such a way that a composition that forms the insulating layer is applied by a coating method such as a spin coating method or a slit coating method and then the composition is baked. However, it is necessary to form the insulating layer 115 thick in a depression portion of the insulating layer 107 and the wires 108 and 109 that serve as a base for the insulating layer 115 though the insulating layer 115 may be thin in a projection portion thereof. As a result, as compared with the case of forming an insulating layer over an insulating layer and wires that have little depression and projection difference, the amount of compositions that form the insulating layer 115 increases and material cost increases, as well as the productivity is reduced. Moreover, in the case where the insulating layer 115 is formed with a photosensitive material and light-exposed in later steps, a problem occurs that a light-exposure time extends if the film is thick.

Further, as shown in FIG. 16B, depression and projection difference in a region 116 of the wire 109 where the thick conductive layer 106 overlaps with the insulating layer 107 is larger than in a region 117 of the wire 109 where the insulating layer 107 does not overlap with the conductive layer 106. Thus, uniform application of the composition is interrupted in the regions 116 and 117, resulting in that the film thickness of the insulating layer 115 decreases in the region 116. Accordingly, a problem occurs that a wire formed over the insulating layer 115 is easily short-circuited with the wire 109.

SUMMARY OF THE INVENTION

Therefore, it is an object of the present invention to provide a semiconductor device with a structure capable of relaxing depression and projection difference of wires.

A semiconductor device according to one aspect of the present invention comprises a first conductive layer, an insulating layer over the first conductive layer, at least one contact hole formed in the insulating layer, and a second conductive layer which is formed over the insulating layer and which is in contact with the first conductive layer in the contact hole, wherein a part of an end portion of the second conductive layer is located inside the contact hole, and wherein the part of the end portion of the second conductive layer is in contact with the first conductive layer.

The second conductive layer partially overlaps with the first conductive layer.

Moreover, the second conductive layer has a region with a first film thickness and a region with a second film thickness, wherein the first film thickness is thinner than the second film thickness and wherein the first conductive layer may be connected to the second conductive layer in the region with the first film thickness of the second conductive layer.

Moreover, a pixel electrode may be provided to be connected to the second conductive layer.

Furthermore, a part of the end portion of the first conductive layer that is connected to the second conductive layer may be formed inside the contact hole.

A semiconductor device according to an aspect of the present invention comprises a first conductive layer, a second conductive layer, an insulating layer which is formed between the first conductive layer and the second conductive layer and which has a contact hole, and a third conductive layer which is connected to the first conductive layer and the second conductive layer and of which at least a part of an end portion is formed inside the contact hole.

In addition, a semiconductor device according to an aspect of the present invention comprises a first conductive layer, a second conductive layer, an insulating layer which is formed between the first conductive layer and the second conductive layer and which has a contact hole, and a third conductive layer which is connected to the first conductive layer and the second conductive layer and of which at least an end portion connected to the second conductive layer is formed inside the contact hole.

A part of the end portion of the second conductive layer that is connected to the third conductive layer is formed inside the contact hole.

Moreover, the contact hole where the first conductive layer is connected to the third conductive layer may be different from the contact hole where the second conductive layer is connected to the third conductive layer. Moreover, the contact hole where the first conductive layer is connected to the third conductive layer may be the same as the contact hole where the second conductive layer is connected to the third conductive layer.

An insulating layer for insulating the first conductive layer and the second conductive layer may be provided between the first conductive layer and the second conductive layer. The second conductive layer may overlap with a part of the first conductive layer.

The second conductive layer may have a region with a first film thickness and a region with a second film thickness, wherein the first film thickness is thinner than the second film thickness and wherein the third conductive layer may be connected to the second conductive layer in the region with the first film thickness of the second conductive layer.

A pixel electrode may be provided to be connected to the second conductive layer.

A source region or a drain region of a first transistor can be used as the first conductive layer and a gate electrode of a second transistor can be used as the second conductive layer. As the third conductive layer, a wire for connecting the gate electrode to the one of the source region and the drain region can be used.

A semiconductor device according to an aspect of the present invention comprises a first conductive layer and a second conductive layer connected to the first conductive layer, wherein at least a part of an end portion of the second conductive layer is located inside a contact hole. In other words, the second conductive layer overlaps with the first conductive layer without having a first insulating layer interposed therebetween near the contact hole where the first conductive layer is connected to the second conductive layer, and the end portion of the second conductive layer is not formed over the first insulating layer. This allows depression and projection of the second conductive layer to be decreased.

This also makes it possible to decrease depression and projection of the second insulating layer formed over the second conductive layer.

In the semiconductor device of the present invention, the second conductive layer and the third conductive layer which connects the first conductive layer and the second conductive layer are connected to each other in the contact hole and at least a part of an end portion of the third conductive layer is located inside the contact hole. In other words, near the contact hole where the second conductive layer is connected to the third conductive layer, the third conductive layer does not overlap with the second conductive layer with the first insulating layer interposed therebetween and the end portion of the third conductive layer is not formed over the first insulating layer. For this reason, it is possible to decrease depression and projection of the third conductive layer.

Thus, depression and projection of the second insulating layer formed over the third conductive layer can also be decreased. In the case of forming the second insulating layer having superior flatness by a coating method, it is not necessary to form the second insulating layer thick; therefore, the material can be reduced. This makes it possible to achieve cost reduction and high productivity.

In the case of forming the second insulating layer with a photosensitive material, it is possible to form the second insulating layer with relatively uniform thickness. In comparison with before, light-exposure time can be shortened because it is not necessary to form the second insulating layer thick. This allows throughput to be improved.

Further, it is possible to decrease the depression and projection of the second insulating layer, to prevent conductive layers formed over and under the second insulating layer from short-circuiting, to improve reliability of the semiconductor device, and to increase yield.

In addition, it is possible to decrease the depression and projection of the second insulating layer; to prevent upper and lower electrodes from short-circuiting even though an element is formed with a narrow space between the upper and lower electrodes formed over the second insulating layer, such as an EL element of which an organic compound layer sandwiched between the upper and lower electrodes is thin; to improve reliability of the semiconductor device; and to increase yield.

Moreover, in the case of forming the second insulating layer having superior flatness by a coating method, nonuniform application of a material can be suppressed. Thus, it is possible to avoid short-circuiting between the third conductive layer and a fourth conductive layer formed over the second insulating layer. This allows a high-reliable semiconductor device to be manufactured.

BRIEF DESCRIPTION OF THE DRAWINGS

In the accompanying drawings:

FIGS. 4A to 4C are top and cross-sectional views showing a semiconductor device of the present invention;

FIGS. 6A and 6B are cross-sectional views showing a semiconductor device of the present invention;

FIGS. 7A to 7C are top views showing a semiconductor device of the present invention;

FIGS. 16A to 16C are top and cross-sectional views showing a semiconductor device of the present invention;

FIGS. 19A to 19C are top and cross-sectional views showing a semiconductor device of the present invention;

DETAILED DESCRIPTION OF THE INVENTION

Figure 1A:
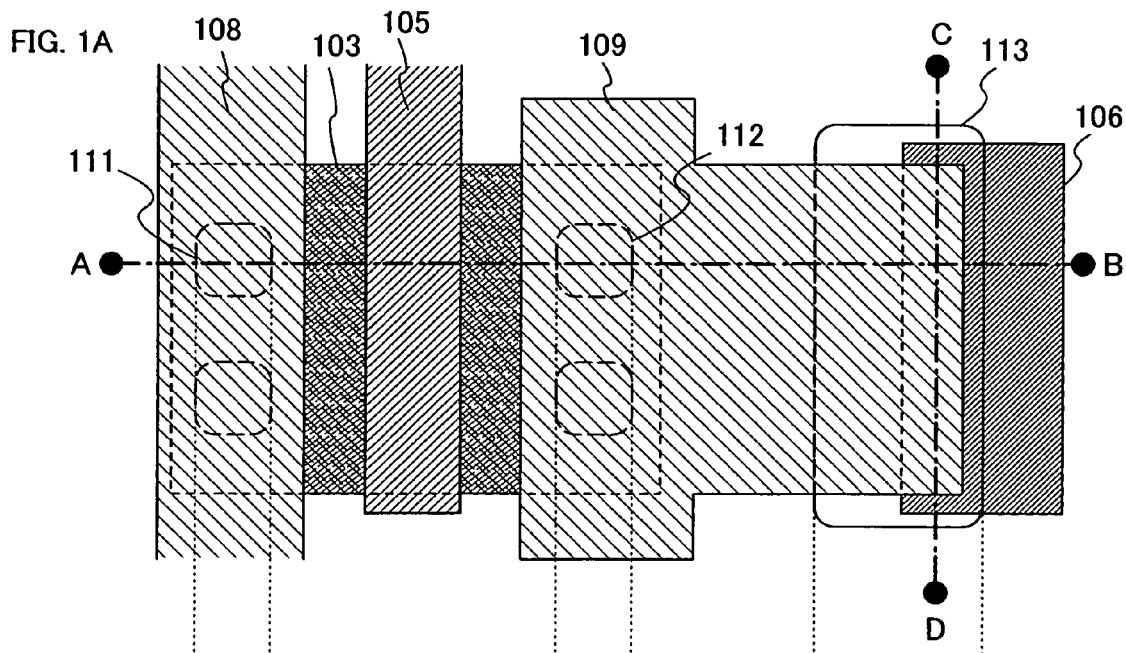
FIGS. 1A to 1C are top and cross-sectional views showing a semiconductor device of the present invention.

Embodiment modes and embodiments are hereinafter described with reference to the drawings. However, since the present invention can be embodied with many different modes, it is easily understood by those skilled in the art that the mode and detail of the present invention can be variously modified without departing from the scope of the present invention. Therefore, the present invention is not construed as being limited to the description of the embodiment modes and embodiments hereinafter shown. In the drawings for explaining the embodiment modes and embodiments, the same parts or parts having a similar function are denoted with the same reference numerals, and description of such parts is not repeated.

Embodiment Mode 1

This embodiment mode will describe a semiconductor device in which a plurality of conductive layers formed with an insulating layer interposed therebetween are connected to each other inside a contact hole and at least a part of an end portion of one conductive layer is located inside the contact hole. Typically, with reference to FIGS. 1A to 1C, this embodiment mode will describe a semiconductor device which includes a third conductive layer connected to a first conductive layer and a second conductive layer, in which the second conductive layer and the third conductive layer are connected to each other inside a contact hole, in which an end portion of the third conductive layer is located inside the contact hole, and in which the third conductive layer is connected to the first conductive layer and the second conductive layer in different contact holes.

Here, one of a source region and a drain region of a semiconductor region of a first transistor is used as the first conductive layer, a gate electrode of a second transistor is used as the second conductive layer, and a wire for connecting the gate electrode to the one of the source region and the drain region is used as the third conductive layer. Here, the first transistor and the second transistor are thin film transistors.

In this embodiment mode, the first conductive layer preferably has a thickness from 20 to 100 nm, more preferably from 40 to 60 nm. The second conductive layer preferably has a thickness from 200 to 600 nm, more preferably from 300 to 500 nm.

Although the source region or the drain region of the first transistor is described as the first conductive layer in this embodiment mode, the present invention is not limited to this, and a wire, an electrode, a terminal, a pixel electrode, and the like which are formed by using a metal layer can be appropriately used as the first conductive layer. Moreover, although the gate electrode of the second transistor is described as the second conductive layer in this embodiment mode, the present invention is not limited to this, and a wire, another electrode, a terminal, a pixel electrode, a source region, a drain region, and the like which are formed by using a metal layer can be appropriately used as the second conductive layer.

Figure 1B:
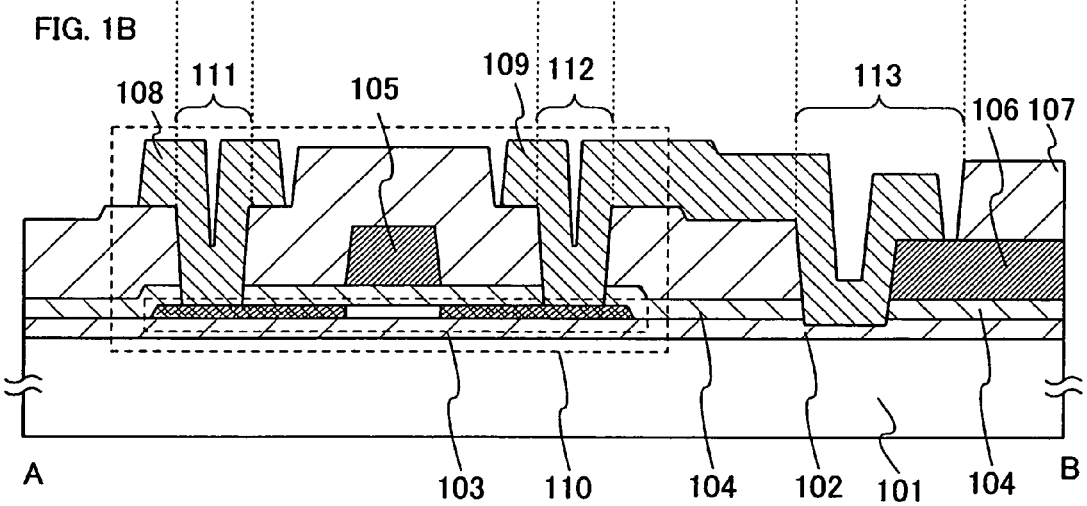
Figure 1C:
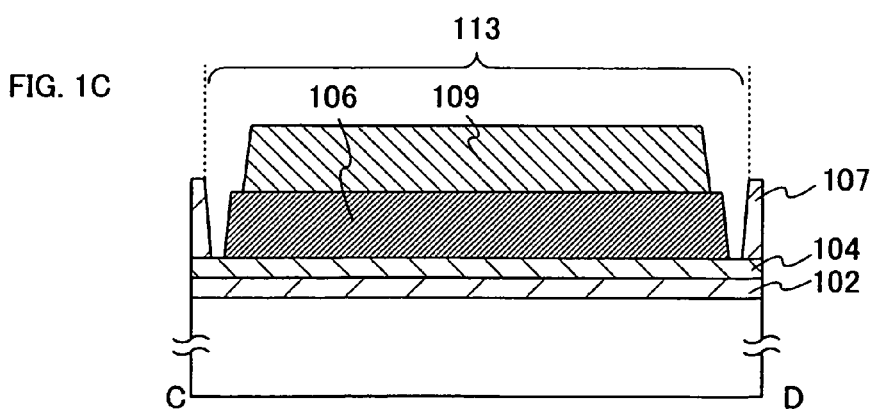

FIG. 1A is a top view of the first transistor, and FIGS. 1B and 1C are cross-sectional views taken along lines A-B and C-D of FIG. 1A, respectively. In FIG. 1A, the substrate 101, the insulating layers 102 and 107, and the gate insulating layer 104 which are shown in FIGS. 1B and 1C are omitted.

As shown in FIG. 1B, the insulating layer 102 is formed over the substrate 101, and the thin film transistor 110 is formed as the first transistor over the insulating layer 102. The thin film transistor 110 has the semiconductor region 103 formed over the insulating layer 102, the gate electrode 105, the wires 108 and 109, the gate insulating layer 104 for insulating the semiconductor region 103 and the gate electrode, and the insulating layer 107 for insulating the gate electrode 105 and the wires 108 and 109.

Moreover, a conductive layer functioning as a gate electrode (hereinafter referred to as a gate electrode 106) of the second transistor formed at the same time as the gate electrode 105 is formed over the gate insulating layer 104.

In this embodiment mode, the wire 109 which is the third conductive layer is connected to the source region or the drain region of the semiconductor region which is the first conductive layer in a contact hole 112 formed in the insulating layer 107. Moreover, the wire 109 which is the third conductive layer is connected to the gate electrode 106 which is the second conductive layer in a contact hole 113 formed in the insulating layer 107. Moreover, a part of an end portion of the wire 109 which is the third conductive layer is located inside the contact hole 113. Accordingly, the end portion of the wire 109 which is the third conductive layer is not formed over the insulating layer 107 in a region where the wire 109 which is the third conductive layer overlaps with the gate electrode 106 which is the second conductive layer, whereby depression and projection of the wires can be decreased. In particular, in a region where thick conductive layers (here, the gate electrode 106 which is the second conductive layer and the wire 109 which is the third conductive layer) are in contact with each other, since the end portion of the conductive layer is not formed over the insulating layer, the depression and projection of the wires can be decreased.

Further, an end portion of the gate electrode 106 which is the second conductive layer, that is in contact with the wire 109 which is the third conductive layer is also located inside the contact hole 113.

If the semiconductor region 103 including the source region or the drain region which is the first conductive layer has a thickness of 20 to 100 nm, moreover 40 to 60 nm, the wire 109 which is the third conductive layer can be formed over a part of the insulating layer 107 that overlaps with the semiconductor region 103. This is because, since the semiconductor region 103 including the source region or the drain region which is the first conductive layer is thinner than the gate electrode 106 which is the second conductive layer, the wire 109 over the part of the insulating layer 107 that overlaps with the semiconductor region 103 is unlikely to project from a surface of the insulating layer 107 that covers the gate electrode 105.

As shown in FIG. 1C, the end portion of the wire 109 is not formed over the insulating layer 107 but is formed over the gate electrode 106 which is the second conductive layer.

Moreover, end portions of the wire 109 and the gate electrode 106 which is the second conductive layer are located inside the contact hole 113.

Figure 8A:
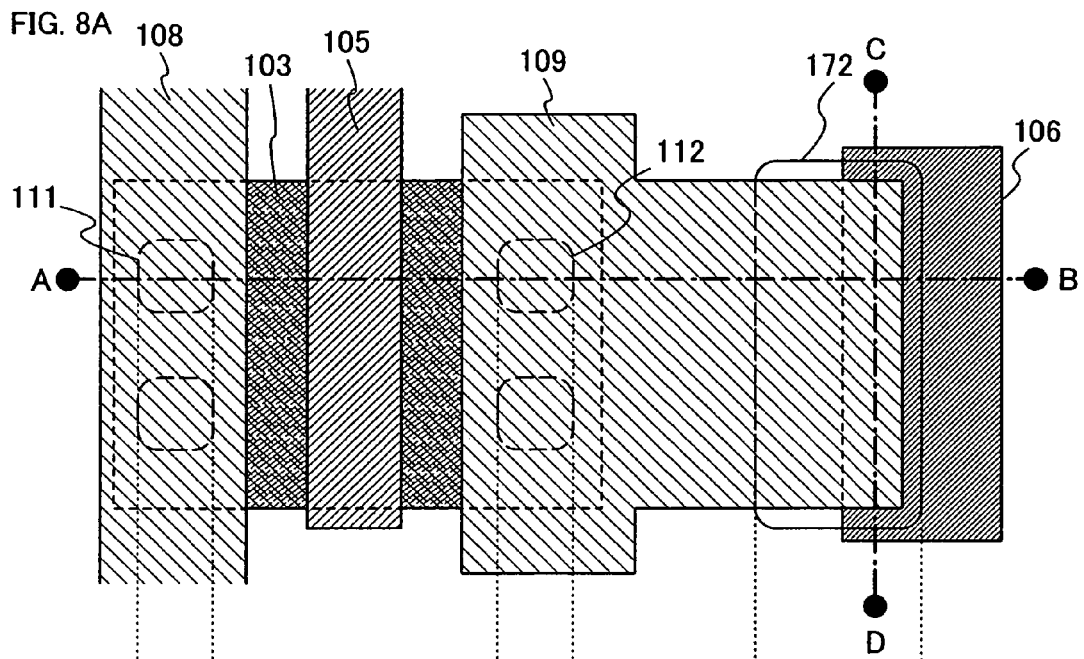
FIGS. 8A to 8C are top and cross-sectional views showing a semiconductor device of the present invention.
Figure 8B:
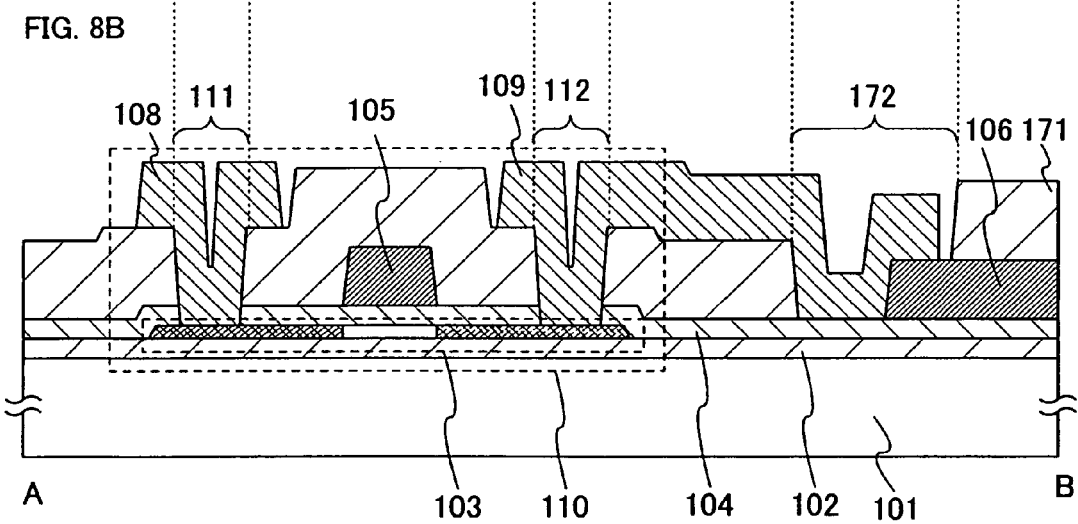
Figure 8C:
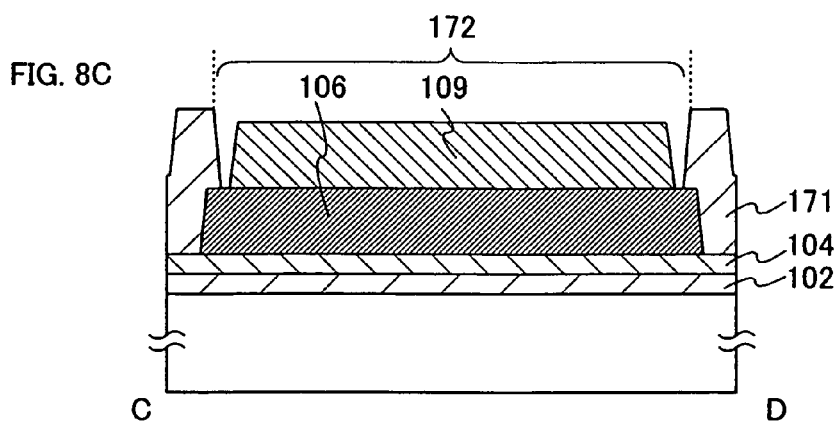

The contact hole where the gate electrode 106 which is the second conductive layer is connected to the wire 109 which is the third conductive layer may have a shape shown in FIGS. 8A and 8C in which an end portion of an insulating layer 171 is located over the gate electrode 106 which is the second conductive layer, instead of the shape shown in FIG. 1C in which the end portions of the wire 109 which is the third conductive layer and the gate electrode 106 which is the second conductive layer are located inside the contact hole 113. In other words, near a region where the gate electrode 106 which is the second conductive layer and the wire 109 which is the third conductive layer are in contact with each other, the end portion of the gate electrode 106 which is the second conductive layer is not exposed by being covered with the insulating layer 171 and only the end portion of the wire 109 which is the third conductive layer may be exposed.

In this embodiment mode, each of upper surfaces of the contact holes 111 and 112 may have a circular shape, a rectangular shape, an elliptical shape, or the like appropriately. Moreover, although the number of contact holes 113 is one, the number thereof may be more than one.

Here, a structure of the thin film transistor 110 which is the first transistor is described.

As the substrate 101, a glass substrate, a quartz substrate, a ceramic substrate, a plastic substrate which can resist process temperature in later steps, a silicon wafer, a metal plate, or the like can be used. In the case of using a glass substrate, a metal substrate, or the like for the substrate, it is desirable to provide the insulating layer 102 in order to prevent impurities from diffusing from the substrate to a semiconductor layer formed afterward. The insulating layer 102 is formed with silicon oxide ($SiO_x$), silicon nitride ($SiN_x$), silicon oxynitride, aluminum nitride ($AlN_x$), or the like. As the substrate 101, an SOI (silicon on insulator) or the like can also be formed. If the substrate 101 is a glass substrate, a large substrate with a size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used. In the case of using a plastic substrate as the substrate 101, a material having a comparatively high glass transition point, such as PC (polycarbonate), PES (polyethylene sulfonate), PET (polyethylene terephthalate), or PEN (polyethylene naphthalate) is preferably used. Moreover, if a glass substrate, a quartz substrate, or a silicon wafer is used for the substrate 101, the substrate may be polished. This step makes it possible to thin the semiconductor device to be formed afterward.

In the case of forming silicon oxide ($SiO_x$), silicon nitride ($SiN_x$), or silicon oxynitride as the insulating layer 102, the insulating layer 102 may be formed by processing a surface of the substrate 101 with high-density plasma. The high-density plasma is generated by using a microwave of, for example, 2.45 GHz under conditions where electron density ranges from $1\times10^{11}$ to $1\times10^{13}/cm^3$, electron temperature is 2 eV or less, and ion energy is 5 eV or less. The kinetic energy of active species is low under such high-density plasma and damage due to plasma is little as compared with a conventional plasma treatment, thereby forming a film with few defects.

For example, the surface of the substrate 101 can be nitrided by conducting the aforementioned high-density plasma treatment under an atmosphere containing nitrogen and noble gas, an atmosphere containing nitrogen, hydrogen, and noble gas, or an atmosphere containing ammonia and noble gas. If a glass substrate, a quartz substrate, a silicon wafer, or the like is used as the substrate 101, a silicon nitride layer containing silicon and nitrogen as its main components can be formed on the surface of the substrate 101 through a nitriding treatment by the aforementioned high-density plasma treatment. The insulating layer 102 may be formed with the use of a plurality of layers by forming a silicon oxide layer or a silicon oxynitride layer over this silicon nitride layer by a plasma CVD method.

By carrying out a nitriding treatment similarly by the high-density plasma to the surface of a silicon oxide layer, a silicon oxynitride layer, or the like, a silicon nitride layer containing nitrogen and silicon as its main components can be formed.

Here, a glass substrate is used as the substrate 101. Moreover, a silicon nitride oxide layer is formed as the insulating layer 102 by a plasma CVD method.

The semiconductor region 103 of the thin film transistor is a layer formed with a semiconductor having a crystal structure, and a non-single crystal semiconductor or a single crystal semiconductor can be used. In particular, it is preferable to use a crystalline semiconductor obtained by crystallizing an amorphous or microcrystal semiconductor through laser irradiation, a crystalline semiconductor obtained by crystallizing through a heat treatment, a crystalline semiconductor obtained by crystallizing through a combination of laser irradiation and a heat treatment. In the heat treatment, a crystallization method using a metal element having a function to promote crystallization of a silicon semiconductor, such as nickel, can be appropriately used.

In the case of crystallizing a semiconductor through laser irradiation, it is possible to use a continuous wave laser beam (CW laser beam) or a pulsed laser beam. As a laser beam that can be used here, one or more of laser beams emitted from the followings can be given: a gas laser such as an Ar laser, a Kr laser, or an excimer laser; a laser whose medium is a single-crystal YAG, $YVO_4$, forsterite ($Mg_2SiO_4$), $YAlO_3$, or $GdVO_4$ or a polycrystalline (ceramic) YAG, $Y_2O_3$, $YVO_4$, $YAlO_3$, or $GdVO_4$, each of which is doped with one or more of Nd, Yb, Cr, Ti, Ho, Er, Tm, and Ta; a glass laser; a ruby laser; an alexandrite laser; a Ti:sapphire laser; a copper vapor laser; and a gold vapor laser. By delivering a fundamental wave of such a laser beam and second to fourth harmonics of the fundamental wave, a crystal with large grain size can be obtained. For example, a second harmonic (532 nm) or a third harmonic (355 nm) of a $Nd:YVO_4$ laser (fundamental wave: 1064 nm) can be used. At this time, the laser needs to have an energy density of about 0.01 to 100 $MW/cm^2$ (preferably 0.1 to 10 $MW/cm^2$). The scan speed is set to about 10 to 200 cm/s, and irradiation is thus carried out.

A laser whose medium is a single-crystal YAG, $YVO_4$, forsterite ($Mg_2SiO_4$), $YAlO_3$, or $GdVO_4$ or a polycrystalline (ceramic) YAG, $Y_2O_3$, $YVO_4$, $YAlO_3$, or $GdVO_4$, each of which is doped with one or more of Nd, Yb, Cr, Ti, Ho, Er, Tm, and Ta; an Ar ion laser; or a Ti:sapphire laser can function as a CW laser and can also function as a pulsed laser with a repetition rate of 10 MHz or higher by Q-switch operation or mode locking. When a laser beam is emitted with a repetition rate of 10 MHz or higher, a semiconductor film is irradiated with a pulsed laser beam after the semiconductor layer is melted by the previous laser beam and before the melted semiconductor film is solidified. Therefore, unlike a pulsed laser with low repetition rate, an interface between a solid phase and a liquid phase can be moved continuously in the semiconductor, whereby crystal grains grown continuously toward a direction where the laser beam is moved can be obtained.

If a ceramic (polycrystal) is used as a laser medium, the medium can be formed into a desired shape at low cost in a short time. In the case of using a single crystal as a laser medium, a cylindrical medium with a diameter of several millimeters and a length of several tens millimeters is used; however, a larger medium can be made by using ceramic.

Since the concentration of dopant in the medium that directly contributes to light emission cannot be changed greatly either in the case of single crystal or polycrystal. Therefore, there is a certain degree of restriction on the increase in output power of a laser by increasing the concentration. However, in the case of ceramic, the size of the medium can be made much larger than that of a single crystal; therefore, drastic increase in output power can be expected.

Moreover, in the case of ceramic, it is possible to easily form a medium with a parallelepiped or cuboid shape. When oscillated light is made to zigzag inside the medium with such a shape, an oscillation optical path can be made longer. Therefore, the amplitude increases to allow oscillation with high output power. Since a laser beam emitted from the medium with such a shape has a square cross-sectional shape at emission, this laser beam is advantageous to be formed into a linear beam, as compared with a circular beam. By shaping thus emitted laser beam with the use of an optical system, it is possible to easily obtain a linear beam with a length of 1 mm or shorter on a short side and a length of several millimeters to several meters on a long side. By irradiating the medium homogeneously with excited light, energy distribution of the linear beam becomes homogeneous in a long side direction.

In the case of applying the above crystallization step to a crystallization process at or below an upper temperature limit of a glass substrate (about 600° C.), a large glass substrate can be used. Therefore, a large number of semiconductor devices can be manufactured per substrate, allowing cost reduction.

The crystallization step may be carried out by heating a glass substrate at or above an upper temperature limit to form the semiconductor region 103. Typically, a quartz substrate is used as the substrate 101 and an amorphous or microcrystalline semiconductor is heated at 700° C. or higher to form the semiconductor region 103. As a result, a semiconductor having high crystallinity can be formed. Thus, a thin film transistor with superior characteristics such as high response speed and high mobility and capable of high-speed operation can be provided.

A MOS transistor may be formed by using a single-crystal semiconductor as the semiconductor region 103.

Since a MOS transistor of which a semiconductor layer is formed with a single-crystal semiconductor has superior characteristics such as high response speed and high mobility, a transistor capable of high-speed operation can be provided. Moreover, since the transistor has little variation in its characteristics, a semiconductor device having high reliability can be provided.

The gate insulating layer 104 is formed by appropriately using a silicon oxide layer, a silicon nitride layer, a silicon oxynitride layer, or the like by a thin film forming method such as a CVD method or a PVD method. Moreover, the gate insulating layer 104 may be formed by processing a surface of the semiconductor region under high-density plasma while introducing oxygen, hydrogen, and noble gas. The high-density plasma is generated by using a microwave of, for example, 2.45 GHz under conditions where electron density ranges from $1\times10^{11}$ to $1\times10^{13}/cm^3$, electron temperature is 2 eV or less, and ion energy is 5 eV or less. Accordingly, a dense and thin gate insulating layer can be formed. After forming a silicon oxide layer, a silicon nitride layer, a silicon oxynitride layer, and the like appropriately by a thin film forming method such as a CVD method or a PVD method, the surface may be processed under high-density plasma while introducing oxygen, hydrogen, and noble gas. Furthermore, after carrying out the high-density plasma treatment while introducing oxygen, hydrogen, and noble gas to the surface of the semiconductor region, a silicon oxide layer, a silicon nitride layer, a silicon oxynitride layer, or the like may be formed appropriately by a CVD method or a PVD method.

The gate electrodes 105 and 106 can be formed with a polycrystalline semiconductor doped with metal or an impurity imparting one conductivity type. In the case of using metal, tungsten (W), molybdenum (Mo), titanium (Ti), tantalum (Ta), aluminum (Al), or the like can be used. Moreover, metal nitride obtained by nitriding metal can also be used. Alternatively, a first layer made of the metal nitride and a second layer made of the metal may be stacked. In the case of a multilayer structure, such a shape is applicable that an end portion of the first layer sticks out to the outside farther than an end portion of the second layer. At this time, by forming the first layer with metal nitride, the first layer can function as barrier metal. In other words, the metal of the second layer can be prevented from diffusing to the gate insulating layer 104 and the semiconductor region 103 thereunder.

Side surfaces of the gate electrodes 105 and 106 may be provided with sidewalls (sidewall spacers). The sidewalls can be obtained by forming an insulating layer with silicon oxide over a substrate by a CVD method and anisotropically etching the insulating layer by an RIE (Reactive Ion Etching) method.

The insulating layer 107 is formed with an inorganic insulating material such as silicon oxide or silicon oxynitride by a thin film forming method such as a CVD method or a PVD method.

The wires 108 and 109 connected to the semiconductor region 103 in the contact holes 111 and 112 of the insulating layer 107 can be provided so as to intersect with wires formed at the same time as the gate electrodes 105 and 106, and this structure forms a multilayer wiring structure. By stacking a plurality of insulating layers similarly to the insulating layer 107 and forming wires over the stacked layers, a multilayer wiring structure can be formed. The wires 108 and 109 are preferably formed with a combination of a low-resistant material such as aluminum (Al) and barrier metal using a high melting point metal material such as titanium (Ti) or molybdenum (Mo), for example a multilayer structure including titanium (Ti) and aluminum (Al) or a multilayer structure including molybdenum (Mo) and aluminum (Al).

The thin film transistor formed by combining the semiconductor region 103, the gate insulating layer 104, the gate electrode 105, the wires 108 and 109, and the like can have various kinds of structures such as a single-drain structure, an LDD structure (Lightly Doped Drain structure), and a gate-overlapped drain structure. Here, a thin film transistor with a single drain structure is shown. It is also possible to appropriately apply a single gate structure, a multi-gate structure in which transistors to which gate voltage of the same potential equally is applied are serially connected, or a dual gate structure in which a semiconductor layer is sandwiched between gate electrodes on its upper and lower sides.

As shown in this embodiment mode, in the semiconductor device having the third conductive layer connected to the first conductive layer and the second conductive layer, the second conductive layer is connected to the third conductive layer in the contact hole and the end portion of the third conductive layer is located inside the contact hole, whereby depression and projection of the third conductive layer can be decreased. Therefore, depression and projection of the insulating layer formed over the third conductive layer can also be decreased. In the case of forming an insulating layer having superior flatness by a coating method, the material can be reduced. Therefore, cost reduction as well as high productivity can be achieved.

Embodiment Mode 2

Figure 2A:
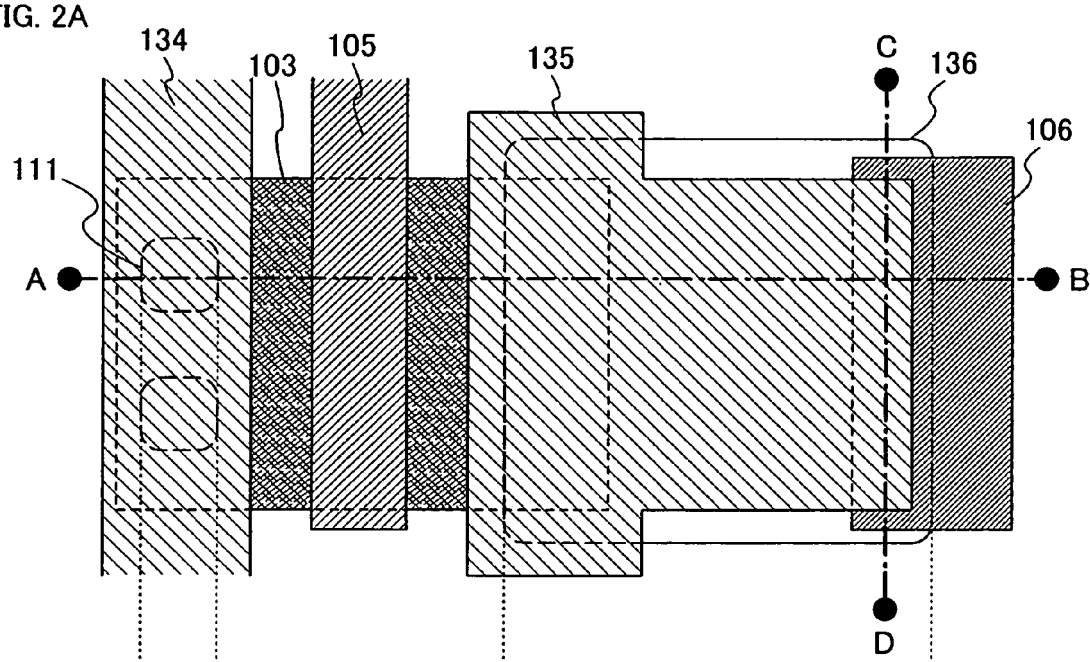
FIGS. 2A to 2C are top and cross-sectional views showing a semiconductor device of the present invention.
Figure 2B:
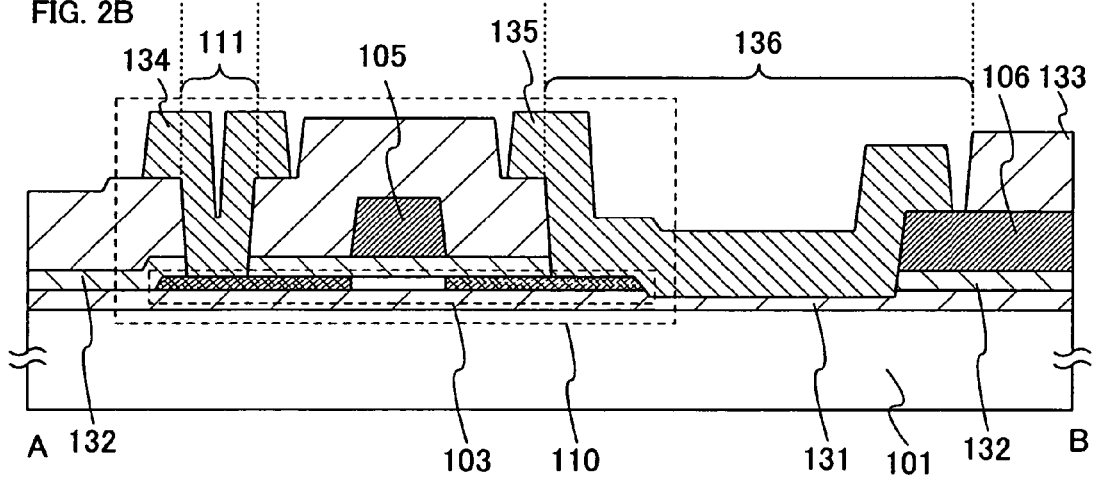
Figure 2C:
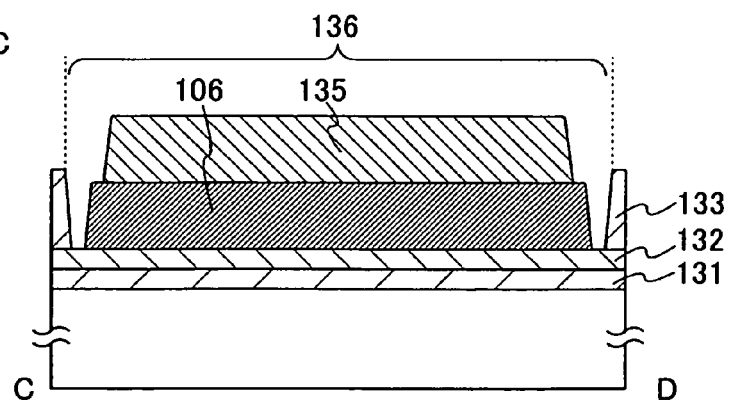

This embodiment mode will describe a semiconductor device with reference to FIGS. 2A to 2C, which has a third conductive layer connected to a first conductive layer and a second conductive layer. In this semiconductor device, the second conductive layer is connected to the third conductive layer in a contact hole, an end portion of the third conductive layer is located inside the contact hole, and the first conductive layer is connected to the third conductive layer in the same contact hole as the contact hole where the second conductive layer is connected to the third conductive layer.

Similarly to Embodiment Mode 1, one of a source region and a drain region of a semiconductor region of a first transistor is used as the first conductive layer, a gate electrode of a second transistor is used as the second conductive layer, and a wire for connecting the gate electrode and the one of the source region and the drain region is used as the third conductive layer. The first transistor and the second transistor are thin film transistors.

FIG. 2A is a top view of the first transistor. FIGS. 2B and 2C are cross-sectional views taken along lines A-B and C-D of FIG. 2A, respectively. In FIG. 2A, the substrate 101, insulating layers 131 and 133, and a gate insulating layer 132 which are shown in FIGS. 2B and 2C are omitted.

As shown in FIG. 2B, the insulating layer 131 is formed over the substrate 101, and the thin film transistor 110 is formed as the first transistor over the insulating layer 131. The thin film transistor 110 has the semiconductor region 103 formed over the insulating layer 131, the gate electrode 105, wires 134 and 135, the gate insulating layer 132 for insulating the semiconductor region 103 and the gate electrode, and the insulating layer 133 for insulating the gate electrode 105 and the wires 134 and 135.

Over the gate insulating layer 132, a gate electrode 106 for the second transistor is formed at the same time as the gate electrode 105.

The insulating layer 131, the gate insulating layer 132, the wires 134 and 135, and the insulating layer 133 can be appropriately formed by using the first insulating layer 102, the gate insulating layer 104, the wires 108 and 109, and the insulating layer 107 shown in Embodiment Mode 1, respectively.

In a contact hole 136, a part of the insulating layer 131 which is not covered with the semiconductor region 103 and the gate electrode 106 which is the second conductive layer may be overetched when the contact holes 111 and 136 are formed. Here, the insulating layer 131 which has been partially thinned by the overetching is shown. Similarly, a part of the gate insulating layer 132 which is not covered with the gate electrode 106 which is the second conductive layer is etched when the contact holes 111 and 136 are formed.

In this embodiment mode, the wire 135 is connected to the source region or the drain region of the semiconductor region which is the first conductive layer in the contact hole 136 formed in the insulating layer 133 and the gate insulating layer 132. Moreover, in the similar contact hole 136, the wire 135 is connected to the gate electrode 106 which is the second conductive layer. Furthermore, a part of an end portion of the wire 135 is located inside the contact hole 136, whereby the end portion of the wire 135 is not formed over the insulating layer 133 in a region where the wire 135 is in contact with the gate electrode 106 which is the second conductive layer. This makes it possible to decrease depression and projection of the wires. In particular, the end portion of the conductive layer is not formed over the insulating layer in a region where the thick conductive layers (here the wire 135 and the gate electrode 106 which is the second conductive layer) are in contact with each other, the depression and projection of the wire can be decreased.

An end portion of the gate electrode 106 which is the second conductive layer, that is in contact with the wire 135 which is the third conductive layer is also located inside the contact hole 136.

Moreover, as shown in FIG. 2C, an end portion of the wire 135 is not formed over the insulating layer 133 but is formed over the gate electrode 106 which is the second conductive layer. Moreover, the end portions of the wire 135 and the gate electrode 106 which is the second conductive layer are located inside the contact hole 136.

The contact hole 136 where the gate electrode 106 which is the second conductive layer is connected to the wire 135 which is the third conductive layer may have such a shape that an end portion of the insulating layer 107 is located over the gate electrode 106 which is the second conductive layer, similarly to the structure shown in FIG. 8C described in Embodiment Mode 1. In other words, near a region where the gate electrode 106 which is the second conductive layer and the wire 135 which is the third conductive layer are in contact with each other, the end portion of the gate electrode 106 which is the second conductive layer is not exposed by being covered with the insulating layer 133 and only the end portion of the wire 135 which is the third conductive layer may be exposed.

In this embodiment mode, it is possible to enlarge an area where the second conductive layer is in contact with the third conductive layer as well as an area where the first conductive layer is in contact with the third conductive layer. This makes it possible to decrease contact resistance and to manufacture a semiconductor device capable of high-speed operation.

In the semiconductor device having the third conductive layer connected to the first conductive layer and the second conductive layer, the second conductive layer is connected to the third conductive layer in the contact hole and the end portion of the third conductive layer is located inside the contact hole. This structure allows decrease in depression and projection of the third conductive layer. Thus, it is also possible to decrease depression and projection of the insulating layer formed over the third conductive layer, to reduce material in the case of forming an insulating layer having superior flatness by a coating method, and therefore to achieve cost reduction as well as high productivity.

Embodiment Mode 3

Figure 3A:
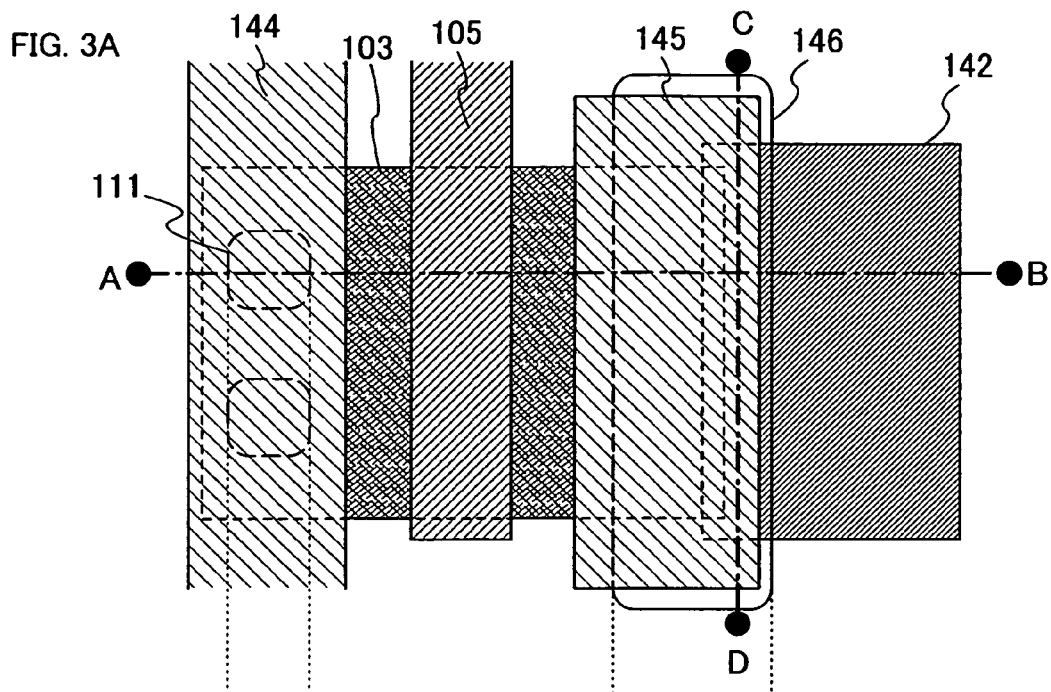
FIGS. 3A to 3C are top and cross-sectional views showing a semiconductor device of the present invention.
Figure 3B:
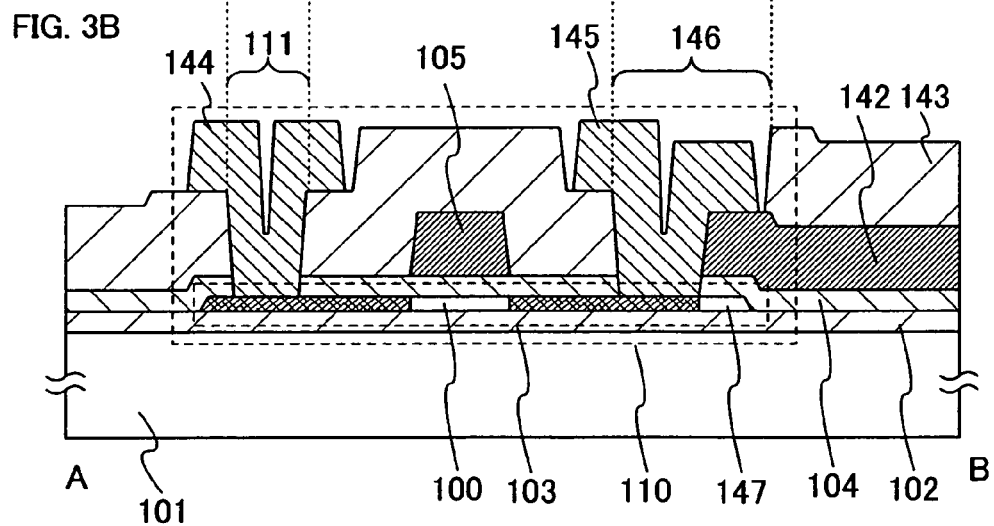
Figure 3C:
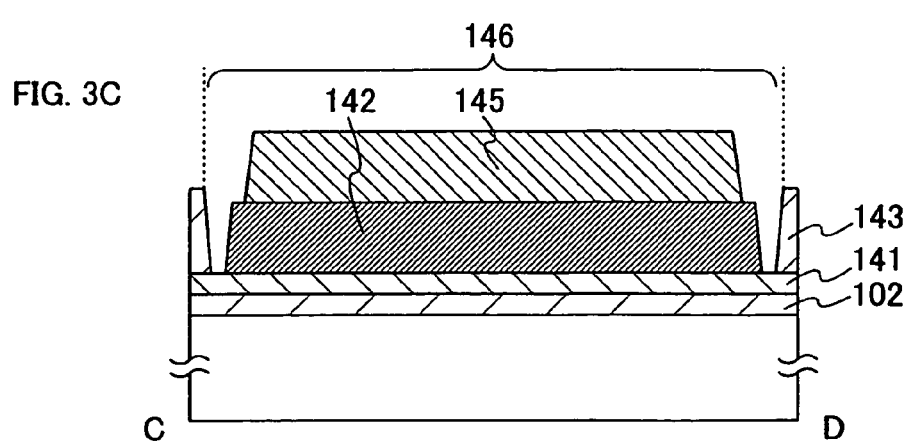

Embodiment Mode 3 will describe a semiconductor device with reference to FIGS. 3A to 3C, in which a part of the second conductive layer overlaps with a part of the first conductive layer in Embodiment Mode 2.

In this embodiment mode, similarly to Embodiment Mode 1, one of a source region and a drain region of a semiconductor region of a first transistor is used as the first conductive layer, a gate electrode of a second transistor is used as the second conductive layer, and a wire for connecting the gate electrode to the one of the source region and the drain region is used as the third conductive layer. The first transistor and the second transistor are thin film transistors.

FIG. 3A is a top view of the first transistor, and FIGS. 3B and 3C are cross-sectional views taken along lines A-B and C-D of FIG. 3A, respectively. In FIG. 3A, the substrate 101, the insulating layers 102 and 143, and the gate insulating layer 104 which are shown in FIGS. 3B and 3C are omitted.

As shown in FIG. 3B, the insulating layer 102 is formed over the substrate 101, and the thin film transistor 110 is formed as the first transistor over the insulating layer 102. The thin film transistor 110 has the semiconductor region 103 formed over the insulating layer 102, the gate electrode 105, wires 144 and 145, the gate insulating layer 104 for insulating the semiconductor region 103 and the gate electrode 105, and the insulating layer 143 for insulating the gate electrode 105 and the wires 144 and 145.

Moreover, a gate electrode 142 of the second transistor is formed over the gate insulating layer 104 at the same time as the gate electrode 105. Here, a part of the gate electrode 142 of the second transistor overlaps with a part of the semiconductor region 103 of the first transistor. Therefore, a region of the semiconductor region 103 which overlaps with the gate electrode 142 has a region 147 that is not doped with impurities, similarly to a semiconductor region 100 (channel region) covered with the gate electrode 105.

In this embodiment mode, the gate electrode 142, the wires 144 and 145, and the insulating layer 143 can be formed by appropriately using the gate electrode 106 which is the second conductive layer, the wires 108 and 109, and the insulating layer 107 of Embodiment Mode 1.

In this embodiment mode, the wire 145 is connected to the source region or the drain region of the semiconductor region 103 which is the first conductive layer, in a contact hole 146 formed in the insulating layer 143 and the gate insulating layer 104. The wire 145 is also connected to the gate electrode 142 of the second thin film transistor in the contact hole 146. Moreover, in a region where the wire 145 is connected to the gate electrode 142, a part of the end portion of the wire 145 is located inside the contact hole 146. Therefore, the end portion of the wire 145 is not formed over the insulating layer 143 in a region where the wire 145 is in contact with the gate electrode 142. This makes it possible to decrease depression and projection of the wires. In particular, since the end portion of the wire 145 is not formed over the insulating layer in a region where the thick conductive layers (here the gate electrode 142 and the wire 145) are in contact with each other, the depression and projection of the wires can be decreased.

An end portion of the gate electrode 142 which is the second conductive layer, that is in contact with the wire 145 which is the third conductive layer is also located inside the contact hole 146.

Moreover, as shown in FIG. 3C, the end portion of the wire 145 is not formed over the insulating layer 143 but is formed over the gate electrode 142. Moreover, end portions of the wire 145 and the gate electrode 142 are located inside the contact hole 146.

The contact hole 146 where the gate electrode 142 which is the second conductive layer is connected to the wire 145 which is the third conductive layer may have such a shape that an end portion of the insulating layer 143 is located over the gate electrode 142 which is the second conductive layer, similarly to the structure shown in FIG. 8C described in Embodiment Mode 1. In other words, near a region where the gate electrode 142 which is the second conductive layer and the wire 145 which is the third conductive layer are in contact with each other, the end portion of the gate electrode 142 which is the second conductive layer is not exposed by being covered with the insulating layer 143 and only the end portion of the wire 145 which is the third conductive layer may be exposed.

In this embodiment mode, since the gate electrode 142 of the second transistor overlaps with a part of the semiconductor region 103 of the first transistor, a larger number of transistors can be formed per unit area. Accordingly, a highly-integrated semiconductor device can be manufactured.

Further, in the semiconductor device having the third conductive layer connected to the first conductive layer and the second conductive layer, the second conductive layer is connected to the third conductive layer in the contact hole and the end portion of the third conductive layer is located inside the contact hole. This structure can decrease depression and projection of the third conductive layer. Thus, it is possible to decrease depression and projection of the insulating layer formed over the third conductive layer, to reduce material in the case of forming an insulating layer having superior flatness by a coating method, and to achieve cost reduction as well as high productivity.

Embodiment Mode 4

With reference to FIGS. 4A to 4C, Embodiment Mode 4 will describe a semiconductor device where, in any of Embodiment Modes 1 to 3, the second conductive layer has a region with a large film thickness and a region with a small film thickness and the second conductive layer is connected to the third conductive layer in the region with small film thickness. Although this embodiment mode will describe based on Embodiment Mode 1, this embodiment mode can also be appropriately applied to Embodiment Mode 2 or 3.

In this embodiment mode, similarly to Embodiment Mode 1, one of a source region and a drain region of a semiconductor region of a first transistor is used as the first conductive layer, a gate electrode of a second transistor is used as the second conductive layer, and a wire for connecting the gate electrode to the one of the source region and the drain region is used as the third conductive layer. The first transistor and the second transistor are thin film transistors.

FIG. 4A is a top view of the first transistor, and FIGS. 4B and 4C are cross-sectional views taken along lines A-B and C-D of FIG. 4A, respectively. In FIG. 4A, the substrate 101, insulating layers 151 and 155, and a gate insulating layer 152 which are shown in FIGS. 4B and 4C are omitted.

As shown in FIG. 4B, the insulating layer 151 is formed over the substrate 101, and the thin film transistor 110 is formed as the first transistor over the insulating layer 151. The thin film transistor 110 has the semiconductor region 103 formed over the insulating layer 151, a gate electrode 153, wires 156 and 157, the gate insulating layer 152 for insulating the semiconductor region 103 and the gate electrode, and the insulating layer 155 for insulating the gate electrode 153 and the wires 156 and 157.

Over the gate insulating layer 152, a gate electrode 154 of the second transistor is formed at the same time as the gate electrode 153.

The gate electrodes 153 and 154 have regions 153a and 154a each with small film thickness and regions 153b and 154b each with large film thickness, respectively.

In this embodiment mode, the insulating layer 151, the gate insulating layer 152, the wires 156 and 157, and the insulating layer 155 can be formed by appropriately using the insulating layer 102, the gate insulating layer 104, the wires 108 and 109, and the insulating layer 107 which are shown in Embodiment Mode 1, respectively.

Low-concentration impurity regions 150a and 150b are formed in a region where the semiconductor region 103 overlaps with the region 153a with small film thickness of the gate electrode 153.

In a contact hole 159, a part of the insulating layer 151, that is not covered with the semiconductor region 103 and the gate electrode 154 may be overetched in forming the contact holes 111, 158, and 159. Here, the insulating layer 151 which has been partially thinned by the overetching is shown. Similarly, a part of the gate insulating layer 152, that is not covered with the gate electrode 154 is etched in forming the contact holes 111, 158, and 159.

In this embodiment mode, the wire 157 is connected to the source region or the drain region of the semiconductor region which is the first conductive layer, in the contact hole 158 formed in the insulating layer 155 and the gate insulating layer 152. Moreover, the wire 157 is connected to the region 154a with small film thickness of the gate electrode 154 in the contact hole 159 formed in the insulating layer 155 and the gate insulating layer 152. Further, a part of an end portion of the wire 157 is located inside the contact hole 159.

An end portion of the gate electrode 154 which is the second conductive layer, that is in contact with the wire 157 which is the third conductive layer is also located inside the contact hole 159.

In this embodiment mode, the wire 157 is connected to the region 154a with small film thickness of the gate electrode of the second transistor. Therefore, as compared with Embodiment Modes 1 to 3, a proportion of wires projecting upper than the surface of the insulating layer 155 can be reduced.

Moreover, as shown in FIG. 4C, the end portion of the wire 157 is not formed over the insulating layer 155 but is formed over the region 154a with small film thickness of the gate electrode 154. In addition, end portions of the wire 157 and the region 154a with small film thickness of the gate electrode 154 are located inside the contact hole 159.

The contact hole 159 where the gate electrode 154 which is the second conductive layer is connected to the wire 157 which is the third conductive layer may have such a shape that an end portion of the insulating layer 155 is located over the gate electrode 154 which is the second conductive layer, similarly to the structure shown in FIG. 8C described in Embodiment Mode 1. In other words, near a region where the gate electrode 154 which is the second conductive layer and the wire 157 which is the third conductive layer are in contact with each other, the end portion of the gate electrode 154 which is the second conductive layer is not exposed by being covered with the insulating layer 155 and only the end portion of the wire 157 which is the third conductive layer may be exposed.

Here, a method for forming the gate electrodes 153 and 154 that have the regions 153a and 154a with small film thickness and the regions 153b and 154b with large film thickness is described with reference to FIGS. 9A to 9C.

Figure 9A:
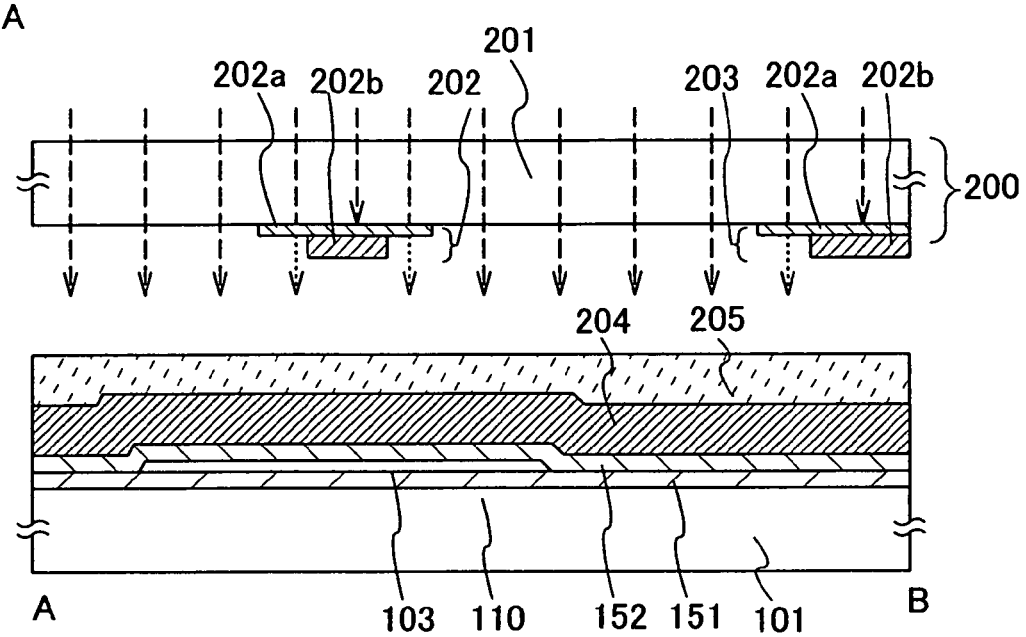
FIGS. 9A to 9C are cross-sectional views showing steps of manufacturing a semiconductor device of the present invention.

As shown in FIG. 9A, a conductive layer 204 is formed over the gate insulating layer 152 and a resist 205 is applied over the conductive layer 204. Next, a part of the resist is light-exposed by using a reticle or a photomask to which a diffractive grating pattern or a semi-transparent assist pattern for reducing light transmittance is provided, and then the light-exposed part of the resist is developed, thereby forming a mask pattern for etching the conductive layer 204. Here, although the conductive layer 204 has a single-layer structure, the conductive layer 204 may have a multilayer structure including a plurality of stacked conductive layers. For example, a first conductive layer formed with nitride of tungsten (W), molybdenum (Mo), titanium (Ti), tantalum (Ta), aluminum (Al), or the like and a second conductive layer formed with such metal may be stacked.

The diffractive grating pattern is a plurality of slits which are apart with a distance of resolution limit or less. By irradiating the resist with light through the slits, it is possible to irradiate the resist with light having an intermediate level (gray level) between levels giving a photosensitive condition and a non-photosensitive condition.

The semi-transparent assist pattern for reducing light transmittance is an assist pattern having a region where exposure light is blocked and a region where light-exposure can be carried out at an intermediate level (gray level) between a photosensitive condition and a non-photosensitive condition.

Here, a part of the resist 205 is light-exposed and developed by using a photomask 200 provided with an assist pattern 202 and an assist pattern 203. The assist pattern 202 has a semi-transparent film 202a formed with molybdenum silicide ($MOSi_x$) and a light-blocking film 202b formed with chromium (Cr). The assist pattern 203 has a semi-transparent film 203a formed with molybdenum silicide ($MOSi_x$) and a light-blocking film 203b formed with chromium (Cr).

Figure 9B:
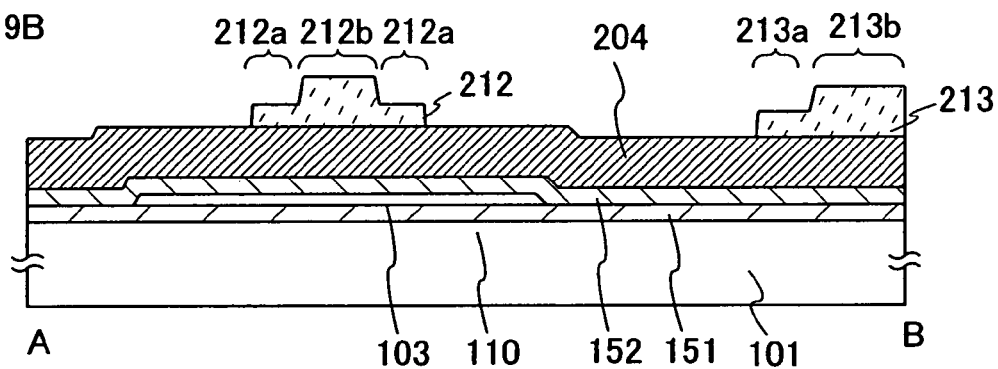
Figure 9C:
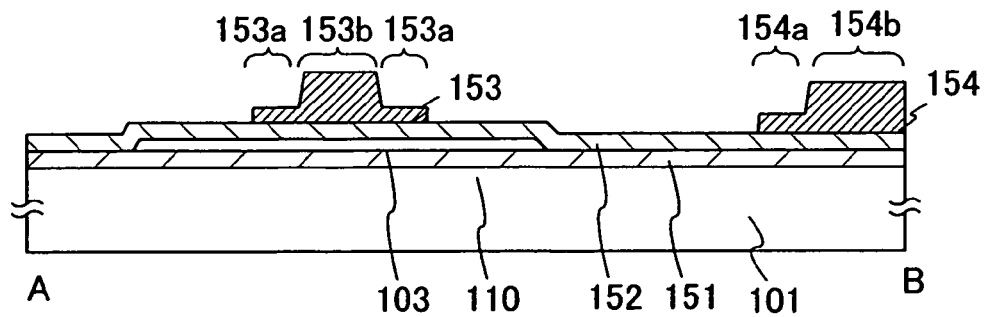

Accordingly, as shown in FIG. 9B, mask patterns 212 and 213 are formed. Cross sections of the mask patterns 212 and 213 respectively have regions 212b and 213b with large film thickness in their central portions and regions 212a and 213a with small film thickness in their end portions.

When the conductive layer 240 is etched by using the mask patterns 212 and 213 having different film thicknesses, the shapes of the mask patterns 212 and 213 are reflected to the shape of the conductive layer to be formed. By effectively using such action, a conductive layer having regions with different film thicknesses can be formed in one photolithography step (one light-exposure). By etching a part of the conductive layer that is covered with the mask pattern 212, the gate electrodes 153 and 154 having the regions 153b and 154b with large film thickness and the regions 153a and 154a with small film thickness can be formed as shown in FIG. 9C.

It is possible to form conductive layers in which a thick conductive layer and a thin conductive layer are stacked, by a method disclosed in Japanese Patent Laid-Open No. 2002-252352 without using a reticle or the photomask having an assist pattern or the diffractive grating as above. Specifically, a thin conductive layer and a thick conductive layer may be formed by stacking two conductive layers having different etching rates and etching and anisotropically-etching these conductive layers into a tapered shape.

Embodiment Mode 5

Figure 5A:
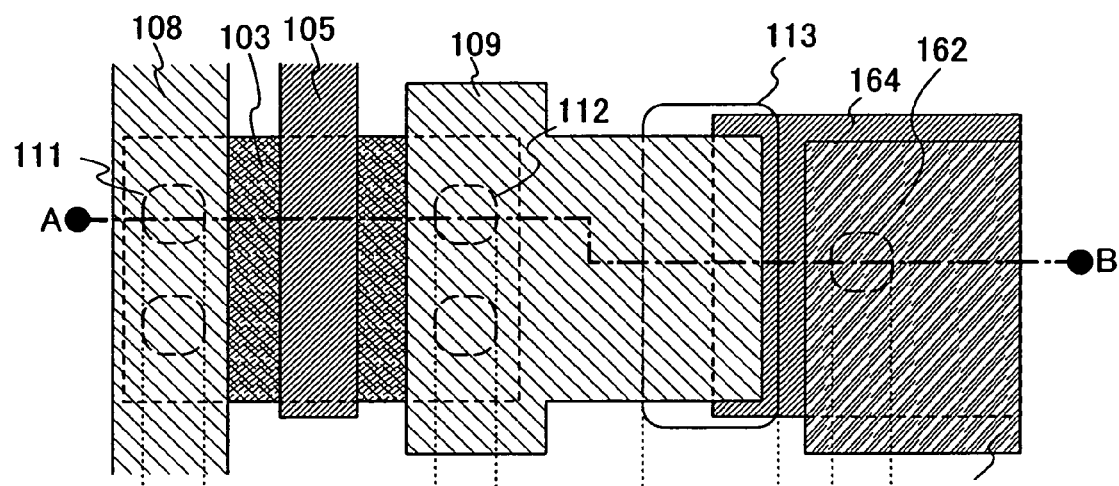
FIGS. 5A and 5B are top and cross-sectional views showing a semiconductor device of the present invention.
Figure 5B:
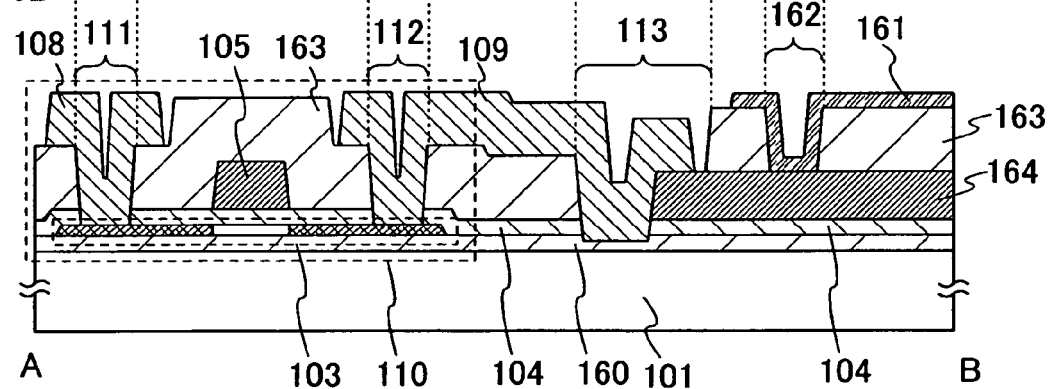

With reference to FIGS. 5A and 5B, this embodiment mode will describe a structure of a pixel electrode connected to a wire of a transistor, which is capable of avoiding separation caused by reduction in coverage of the pixel electrode resulting from film thickness of the wire. Although this embodiment mode will describe based on Embodiment Mode 1, any of Embodiment Modes 2 to 4 can be applied.

Here, one of a source region and a drain region of a thin film transistor is used as the first conductive layer, a contact conductive layer for connecting a pixel electrode and a wire is used as the second conductive layer, and a wire for connecting the contact conductive layer and the one of the source region and the drain region of the semiconductor region is used as the third conductive layer. Further, a thin film transistor is used as the transistor.

FIG. 5A is a top view of a transistor. FIG. 5B is a cross-sectional view taken along a line A-B of FIG. 5A. In FIG. 5A, the substrate 101, insulating layers 160 and 163, and the gate insulating layer 104 which are shown in FIGS. 5B and 5C are omitted.

As shown in FIG. 5B, the insulating layer 160 is formed over the substrate 101, and the thin film transistor 110 is formed as the transistor over the insulating layer 160. The thin film transistor 110 has the semiconductor region 103 formed over the insulating layer 160, the gate electrode 105, the wires 108 and 109, the gate insulating layer 104 for insulating the semiconductor region 103 and the gate electrode, and the insulating layer 163 for insulating the gate electrode 105 and the wires 108 and 109.

Over the gate insulating layer 104, a contact conductive layer 164 is formed at the same time as the gate electrode 105.

In this embodiment mode, the insulating layer 163 can be formed by appropriately using the insulating layer 107 shown in Embodiment Mode 1.

In this embodiment mode, the wire 109 which is the third conductive layer is connected to the source region or the drain region of the semiconductor region 103 which is the first conductive layer, in a contact hole 112 formed in the insulating layer 163 and the gate insulating layer 104. The wire 109 which is the third conductive layer is connected to the contact conductive layer 164 in a contact hole 113 formed in the insulating layer 163 and the gate insulating layer 104. A part of an end portion of the wire 109 which is the third conductive layer is located inside the contact hole 113. Further, the contact conductive layer 164 is connected to a pixel electrode 161 in a contact hole 162 formed in the insulating layer 163.

Moreover, an end portion of the contact conductive layer 164 which is the second conductive layer, that is in contact with the wire 109 which is the third conductive layer is also located inside the contact hole 113.

Figure 17A:
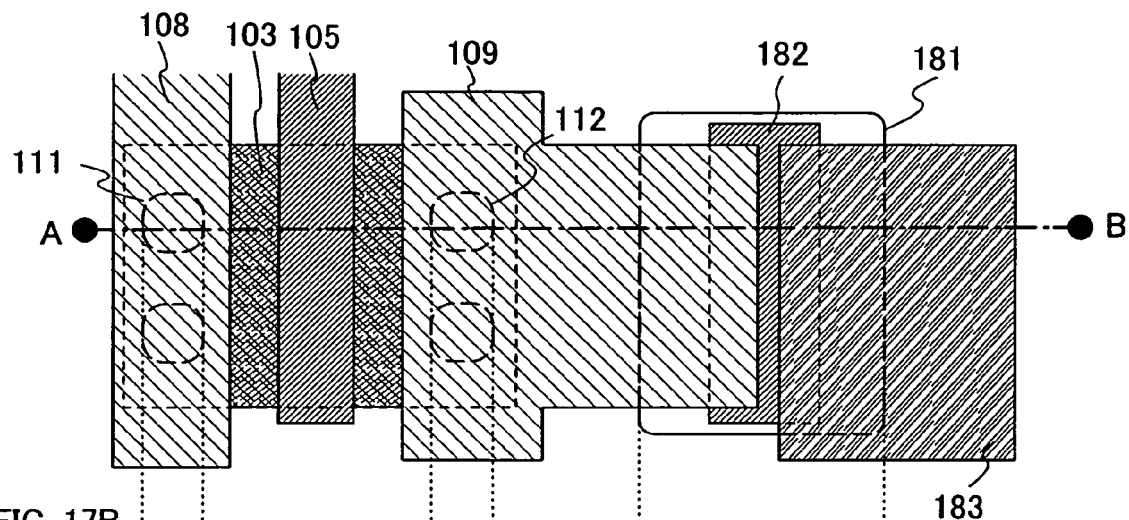
FIGS. 17A and 17B are top and cross-sectional views showing a semiconductor device of the present invention.
Figure 17B:
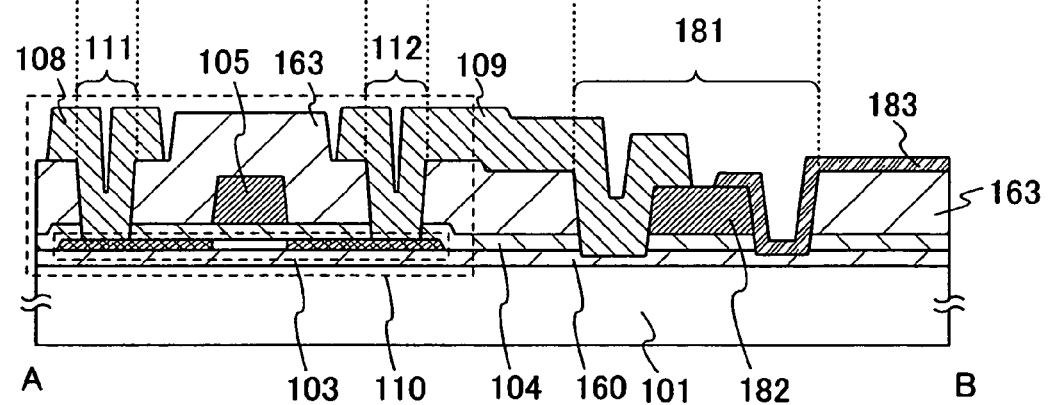

Moreover, a contact conductive layer 182 is located inside a contact hole 181 formed in the insulating layer 163 and the gate insulating layer 104 as shown in FIGS. 17A and 17B. In the contact hole 181, the wire 109 which is the third conductive layer is connected to the contact conductive layer 182 and the pixel electrode 183 is connected to the contact conductive layer 182. It is noted that, in FIGS. 17A and 17B, only an end portion of the contact conductive layer 182 that is in contact with the wire 109 which is the third conductive layer and the pixel electrode 183 needs to be located inside the contact hole 181. A region of the contact conductive layer 182, that is not in contact with the wire 109 which is the third conductive layer and the pixel electrode 183 may be located outside the contact hole 181. In other words, an end portion of the contact conductive layer 182, that is not in contact with the wire 109 which is the third conductive layer and the pixel electrode 183 may be located outside the contact hole 181.

Further, the end portion of the contact conductive layer 182 which is the second conductive layer, that is in contact with the wire 109 which is the third conductive layer is also located inside the contact hole 181. Further, an end portion of the pixel electrode 183, that is in contact with the contact conductive layer 182 is also located inside the contact hole 181.

Figure 18A:
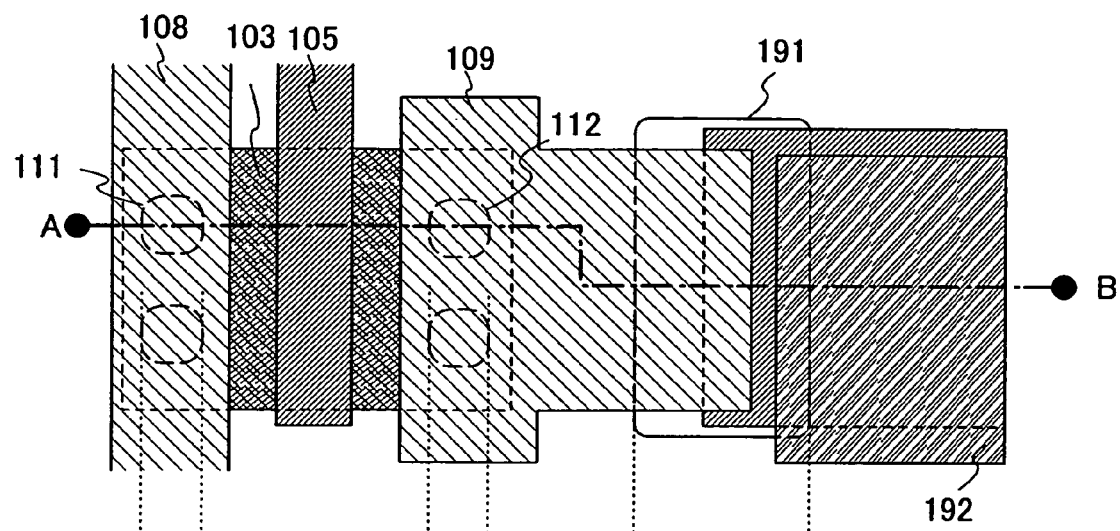
FIGS. 18A and 18B are top and cross-sectional views showing a semiconductor device of the present invention.
Figure 18B:
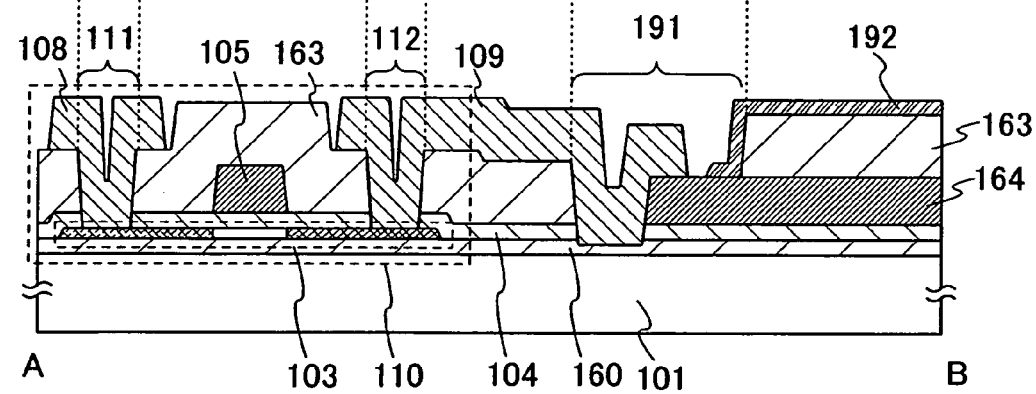

Furthermore, a pixel electrode 192 is connected to the contact conductive layer 164 as well as the wire 109 which is the third conductive layer is connected to the contact conductive layer 164 inside a contact hole 191 formed in the insulating layer 163 and the gate insulating layer 104, as shown in FIGS. 18A and 18B. In FIGS. 18A and 18B, a part of the contact hole 191 is formed over the contact conductive layer 164, and in this region, the contact conductive layer 164 is connected to the pixel electrode 192.

An end portion of the contact conductive layer 164 which is the second conductive layer, that is in contact with the wire 109 which is the third conductive layer is also located inside the contact hole 191. Moreover, an end portion of the pixel electrode 192, that is in contact with the contact conductive layer 164 is also located inside the contact hole 191.

The contact conductive layer 164 overlaps with the pixel electrode 192 even outside the contact hole 191 in FIGS. 18A and 18B.

In this embodiment mode, the thin film transistor is connected to the pixel electrode in such a structure that the pixel electrode does not go over the end portion of the wire 109 which is the third conductive layer, whereby breakage of the pixel electrode can be prevented. In particular, in a region where the thick conductive layers (here the wire 109 which is the third conductive layer and the contact conductive layer 164) are connected to each other, the end portion of the wire 109 which is the third conductive layer is not formed over the insulating layer 163; therefore, the depression and projection of the wire can be decreased.

Embodiment 1

This embodiment will describe an EL display panel with reference to FIGS. 6A to 7C. FIG. 7A is a top view of one pixel of an EL display panel, and FIGS. 6A and 6B are cross-sectional views taken along a line A-B of FIG. 7A. FIG. 7B is an enlarged view of a region where a first pixel electrode is connected to a driver TFT of FIG. 7A. FIG. 7C is an enlarged view of a region where a wire of a switching TFT is connected to a gate electrode of the driver TFT of FIG. 7A.

In the EL display panel shown in FIG. 6A, a pixel including a switching TFT 602, a driver TFT 603, and a light-emitting element 624 is formed over a substrate 600. Here, an insulating layer 601 is formed over the substrate 600 and the switching TFT 602 and the driver TFT 603 are formed over the insulating layer 601.

Here, a glass substrate is used as the substrate 600. The insulating layer 601 is formed by stacking a silicon nitride oxide film with a thickness of 140 nm and a silicon oxynitride film with a thickness of 100 nm in order by a CVD method.

The switching TFT 602 includes a semiconductor region 602a, a gate insulating layer 604, a gate electrode 605, an insulating layer 608, and wires 611 and 612 connected to a source region and a drain region of the semiconductor region. The wires 611 and 612 are connected to the source region and the drain region of the semiconductor region 602a in contact holes 631 and 632 formed in the insulating layer 608.

The driver TFT 603 includes a semiconductor region 603a, the gate insulating layer 604, a gate electrode 606, the insulating layer 608, and wires 613 and 614 connected to a source region and a drain region of the semiconductor region. The wires 613 and 614 are connected to the source region and the drain region of the semiconductor region 603a in contact holes 633 and 634 formed in the insulating layer 608.

The wire 612 of the switching TFT 602 is connected to the gate electrode 606 of the driver TFT 603 inside the contact hole 632 formed in the insulating layer 608. At this time, a part of an end portion of the wire 612 is located inside the contact hole 632.

The wire 614 of the driver TFT 603 is connected in the contact hole 634 to a contact conductive layer 607 formed at the same time as the gate electrodes 605 and 606. In the contact hole 634, the contact conductive layer 607 is connected to a first pixel electrode 615. Here, it is preferable that the wire 614 do not overlap with the first pixel electrode 615. This structure makes it possible to prevent the first pixel electrode 615 from breaking and to prevent pixel defects.

Here, an N-channel TFT is formed as the switching TFT 602. Moreover, a P-channel TFT is formed as the driver TFT 603. The semiconductor regions 602a and 603a are formed by etching a 50-nm-thick crystalline silicon film into a desired shape. The source region and the drain region of the semiconductor region 602a of the switching TFT 602 are doped with phosphorus. The source region and the drain region of the semiconductor region 603a of the driver TFT 603 are doped with boron.

A part of the semiconductor region 602a of the switching TFT 602, that is not covered with the gate electrode 605 has low-concentration impurity regions 625a to 625d doped with phosphorus. Moreover, regions 627a and 627b of the semiconductor region 602a, that are covered with the gate electrode 605 and a region 627c thereof that is covered with the gate electrode 606 are not doped with phosphorus.

A part of the semiconductor region 603a of the driver TFT 603, that is covered with the gate electrode 606 has low-concentration impurity regions 628a to 628c doped with boron. In the semiconductor region 603a, regions 627c to 627e that are covered with the gate electrode 606 and the contact conductive layer 607 are not doped with boron.

As the gate insulating layer 604, a silicon oxide layer with a thickness of 110 nm is formed by a CVD method using tetraethyl ortho silicate (TEOS) and $O_2$ as material gas. The gate electrodes 605 and 606 and the contact conductive layer 607 are formed using a 30-nm-thick tantalum nitride layer and a 370-nm-thick tungsten layer by a sputtering method. The wires 611 to 614 are formed by sequentially stacking a 100-nm-thick titanium layer, a 700-nm-thick aluminum layer, and another 100-nm-thick titanium layer by a sputtering method.

An insulating layer 621 covering the insulating layer 608, the wires 611 to 614, and a part of the pixel electrode 615 is formed. The insulating layer 621 functions as a partition wall for partitioning pixels.

Here, a 50-nm-thick silicon oxynitride layer, a 140-nm-thick silicon nitride oxide layer, and a 670-nm-thick silicon oxynitride layer are formed as the insulating layer 608 by a CVD method. The first pixel electrode 615 is formed with ITO containing silicon oxide with a thickness of 125 nm by a sputtering method. The insulating layer 621 is formed in such a way that a composition is applied by a spin coating method and baked to form 1.2-µm-thick photosensitive polyimide, and light-exposure and development are carried out to expose a part of the first pixel electrode 615.

As the first pixel electrode 615, indium oxide containing tungsten oxide (IWO), indium zinc oxide containing tungsten oxide (IWZO), indium oxide containing titanium oxide (ITiO), indium tin oxide containing titanium oxide (ITTiO), indium tin oxide (ITO), indium zinc oxide (IZO), or the like can be used.

The insulating layer 621 may be formed with siloxane or acrylic in such a way that a composition is applied and baked.

As shown in FIG. 6B, an insulating layer 641 may be formed by a CVD method, a PVD method, or the like instead of the insulating layer 621 formed by a coating method shown in FIG. 6A. Since the wiring structure of this embodiment can relax depression and projection difference of the surfaces of the wires and insulating layer 608, the depression and projection can be decreased even though the insulating layer 641 functioning as a partition wall is formed by a CVD method or a PVD method.

Moreover, a first pixel electrode 683 may be in contact with both of a contact conductive layer 681 and a wire 682 as shown in FIGS. 19A to 19C. In other words, the first pixel electrode 683 is formed so as to be in contact with a part of the contact conductive layer 681 and a part of the wire 682 that are exposed in a contact hole 684. It is to be noted that FIG. 19B is an enlarged view of a region where the driver TFT 603 is connected to the first pixel electrode 683 in FIG. 19A, while FIG. 19C is a cross-sectional view taken along a line B-C of FIG. 19B.

The first pixel electrode 683 may be in contact with only the wire 682.

Although FIG. 19C shows the example in which the insulating layer 621 is formed by a coating method similarly to FIG. 6A, the insulating layer 641 may be formed by a CVD method, a PVD method, or the like instead of the insulating layer 621 similarly to FIG. 6B.

Figure 20:
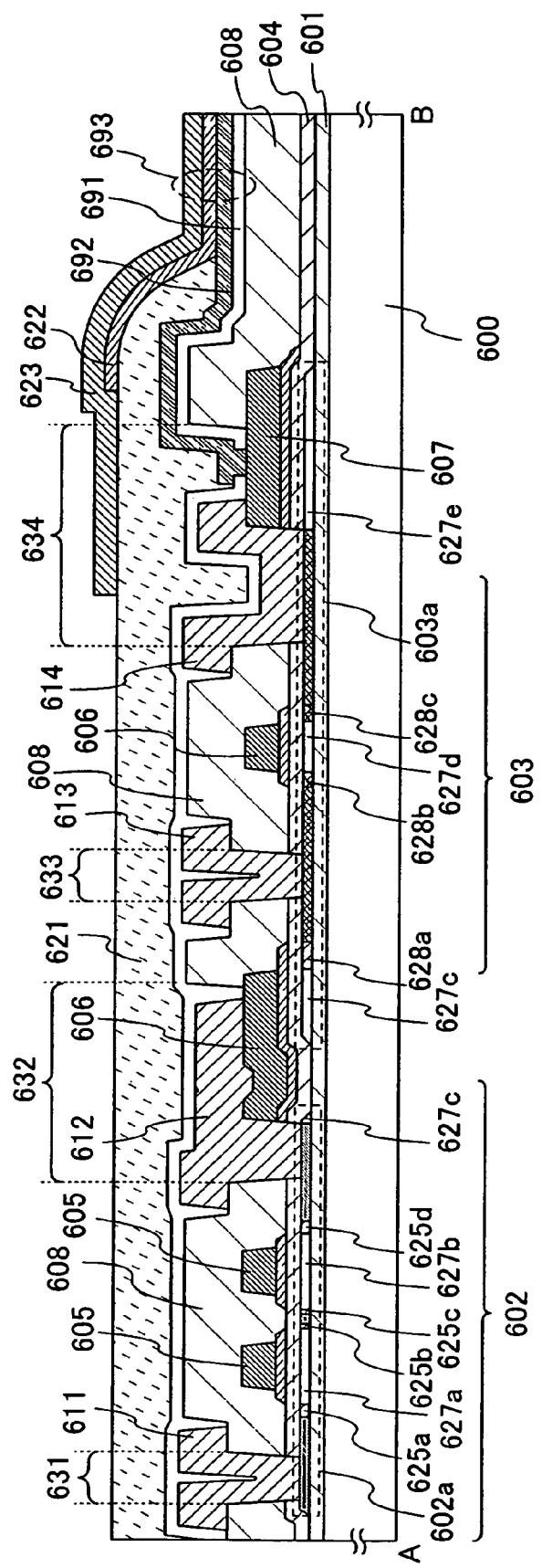
FIG. 20 is a cross-sectional view showing a semiconductor device of the present invention.

Furthermore, an insulating layer 691 may be provided between the insulating layer 608 and the wires 611 to 614, and the insulating layer 621 as shown in FIG. 20. The insulating layer 691 can prevent the wires 611 to 614 from being exposed and prevent external contamination substances from intruding into the TFTs 602 and 603.

Similarly, the insulating layer 691 may be provided between the insulating layer 608 and a first pixel electrode 692. The insulating layer 691 can relax the depression and projection of the insulating layer 608 and decrease depression and projection of the first pixel electrode 692. Accordingly, it is possible to prevent the first pixel electrode 692 and a second pixel electrode 623 from being short-circuited and to reduce display defects of pixels. Here, the light-emitting element 693 can be formed by using the first pixel electrode 692, a light-emitting layer 622, and the second pixel electrode 623.

As the insulating layer 691, an insulating layer is formed by using a silicon oxide film, a silicon nitride film, a silicon oxynitride film, or the like with a thickness of 50 to 300 nm, preferably 100 to 150 nm, over the wires 611 to 614 and the insulating layer 608 by a CVD method or a sputtering method, after forming the wires 611 to 614. The insulating layer may be formed using a single layer or two or more layers. After that, a part of the insulating layer is etched, thereby exposing a part of the contact conductive layer 607. Moreover, in this exposed portion, the first pixel electrode 692 to be electrically connected to the wire 614 with the contact conductive layer 607 interposed therebetween is formed.

Although FIG. 20 shows an example in which the insulating layer 621 is formed by a coating method as shown in FIG. 6A, the insulating layer 641 may be formed by a CVD method, a PVD method, or the like similarly to FIG. 6B, instead of the insulating layer 621.

The light-emitting layer 622 and the second pixel electrode 623 are formed over the first pixel electrode 692. The light-emitting element 693 is formed using the first pixel electrode 692, the light-emitting layer 622, and the second pixel electrode 623.

As shown in FIGS. 7A to 7C, it is desirable that upper surfaces of the gate electrode 605, the contact conductive layer 607, the wires 611 and 612, and the first pixel electrode 615 have an angle larger than 90° at their corners, and it is more desirable that each corner have a shape of a circular arc. Such a shape makes it possible to avoid that plasma is discharged in a concentrated manner (abnormal discharge) at corners when dry etching is conducted. Thus, generation of fine particles due to abnormal discharge can be suppressed. Even if fine particles are generated, such particles are less likely to gather at the corners, which leads to increase in washing effects and suppression of low yield due to the fine particles.

Here, as for a light-emitting element expressing a red color, an ITO layer containing silicon oxide is formed in 125 nm thick as the first pixel electrode. As the light-emitting layer, DNTPD formed in 50 nm thick, NPB formed in 10 nm thick, NPB doped with bis[2,3-bis(4-fluorophenyl)quinoquixali-nato]iridium(acetylacetonate) (abbreviated to Ir(Fdpq)$_2$ (acac)) which is formed in 30 nm thick, Alq$_3$ formed in 30 nm thick, and LiF formed in 1 nm thick are stacked. As the second pixel electrode, an Al layer is formed in 200 nm thick.

As for a light-emitting element expressing a green color, an ITO layer containing silicon oxide is formed in 125 nm thick as the first pixel electrode. As the light-emitting layer, DNTPD formed in 50 nm thick, NPB formed in 10 nm thick, $Alq_3$ doped with coumarin 545T (C545T) which is formed in 40 nm thick, $Alq_3$ formed in 30 nm thick, and LiF formed in 1 nm thick are stacked. As the second pixel electrode, an Al layer is formed in 200 nm thick.

Further, as for a light-emitting element expressing a blue color, an ITO layer containing silicon oxide is formed in 125 nm thick as the first pixel electrode. As the light-emitting layer, DNTPD formed in 50 nm thick, NPB formed in 10 nm thick, 9-[4-(N-carbazolyl)]phenyl-10-phenylanthracene (abbreviated to CzPA) doped with 2,5,8,11-tetra(tert-butyl) perylene (abbreviated to TBP) which is formed in 30 nm thick, $Alq_3$ formed in 30 nm thick, and LiF formed in 1 nm thick are stacked. As the second pixel electrode, an Al layer is formed in 200 nm thick.

Figure 10:
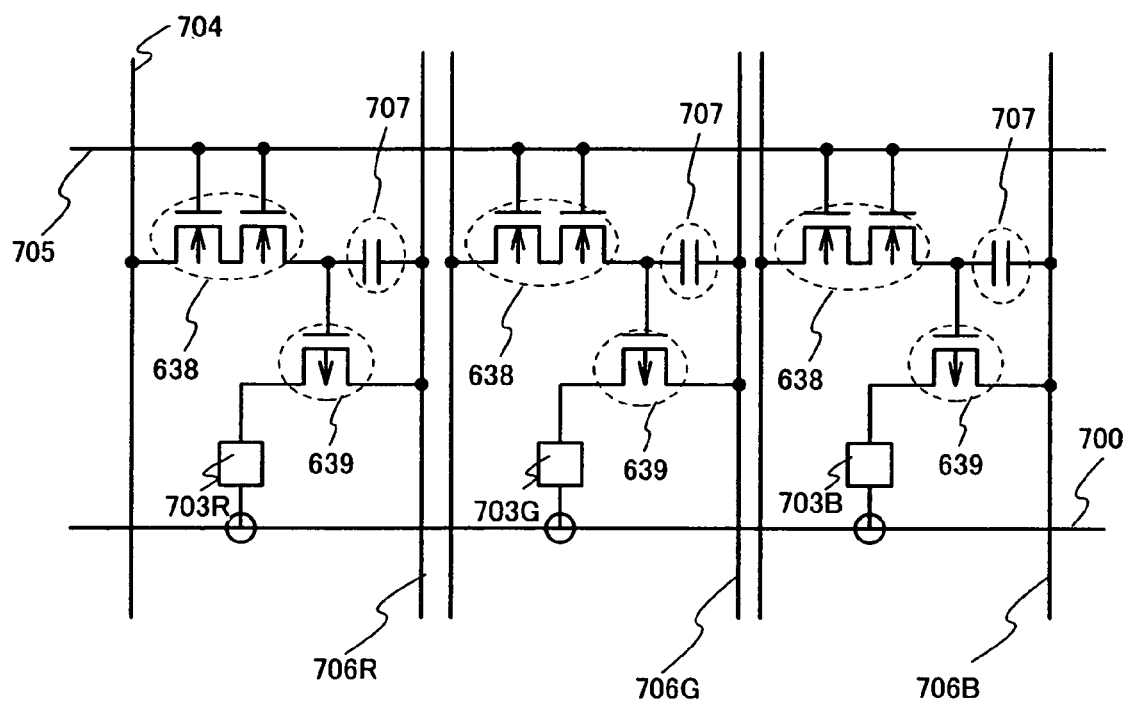
FIG. 10 shows an equivalent circuit diagram of a semiconductor device of the present invention.

In this embodiment, an equivalent circuit diagram of a pixel in the case of full-color display is shown in FIG. 10. In FIG. 10, a TFT 638 surrounded by a dotted line corresponds to the switching TFT 602 of FIGS. 6A and 6B, while a TFT 639 surrounded by a dotted line corresponds to the driver TFT 603.

In the pixel expressing a red color, a drain region of the driver TFT 639 is connected to an OLED 703R for emitting red light while a source region thereof is provided with an anode side power source line (R) 706R. The OLED 703R is provided with a cathode side power source line 700. The switching TFT 638 is connected to a gate wire 705 and a gate electrode of the driver TFT 639 is connected to a drain region of the switching TFT 638. The drain region of the switching TFT 638 is connected to a capacitor element 707 connected to the anode side power source line (R) 706R.

In the pixel expressing a green color, a drain region of the driver TFT is connected to an OLED 703G for emitting green light while a source region thereof is provided with an anode side power source line (G) 706G. The switching TFT 638 is connected to the gate wire 705 and the gate electrode of the driver TFT 639 is connected to the drain region of the switching TFT 638. The drain region of the switching TFT 638 is connected to the capacitor element 707 connected to the anode side power source line (G) 706G.

In the pixel expressing a blue color, a drain region of the driver TFT is connected to an OLED 703B for emitting blue light while a source region thereof is provided with an anode side power source line (B) 706B. The switching TFT 638 is connected to the gate wire 705 and the gate electrode of the driver TFT 639 is connected to the drain region of the switching TFT 638. The drain region of the switching TFT 638 is connected to the capacitor element 707 connected to the anode side power source line (B) 706B.

Voltages that are different depending on EL materials are applied to the pixels with different colors, respectively.

Although the anode side power source lines 706R, 706G, and 706B are formed in parallel with a source wire 704, the present invention is not limited to this, and the gate wire 705 may be formed in parallel with the anode side power source lines 706R, 706G, and 706B. Moreover, the driver TFT 639 may have a multi-gate electrode structure.

In the light-emitting device, a driving method for screen display is not particularly limited. For example, a dot-sequential driving method, a line-sequential driving method, a plane-sequential driving method, or the like can be used for the driving. Typically, the line sequential driving method is used, and may be appropriately combined with a time-division grayscale driving method or an area grayscale driving method. In addition, a video signal to be inputted into a source line of the light emitting device may be an analog signal or a digital signal. A driving circuit or the like may be appropriately designed in accordance with the video signal.

Further, in a light-emitting device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

In the light-emitting device, a protective circuit for preventing electrostatic breakdown (such as a protective diode) may be provided.

This embodiment can be freely combined with any of Embodiment Modes 1 to 5.

Next, an EL display panel having the pixels shown in FIGS. 6A to 7C and FIG. 10 in a pixel portion thereof will be described with reference to FIG. 11.

Figure 11:
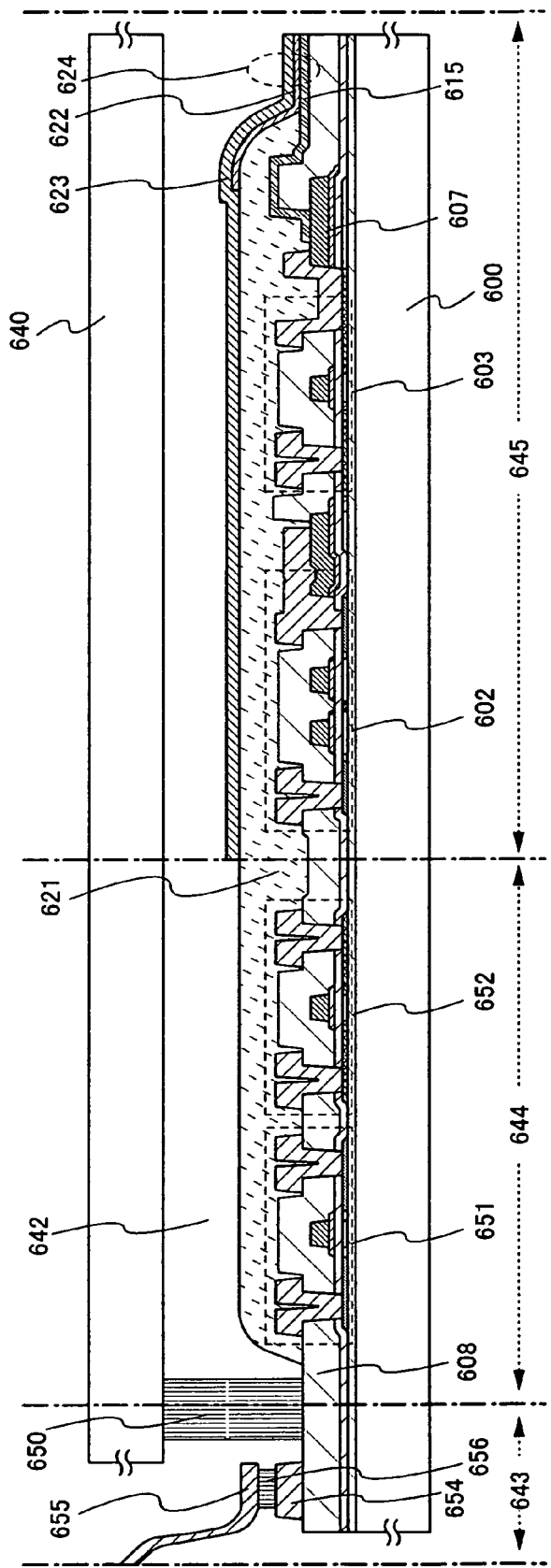
FIG. 11 is a cross-sectional view showing a semiconductor device of the present invention.

FIG. 11 is a cross-sectional view of an EL display panel. In the EL display panel, the insulating layer 608 formed at a first substrate 600 and a second substrate 640 are sealed by a sealing material 650. As the sealing material 650, an epoxy-based resin having high viscosity including filler is preferably used. It is desirable that the sealing material do not transmit moisture or oxygen as much as possible.

A driver circuit portion 644 and a pixel portion 645 are formed in such a way that they are surrounded by the sealing material 650, the first substrate 600, and the second substrate 640. Moreover, a terminal portion 643 is provided outside the sealing material 650.

At the terminal portion 643, a contact terminal connected to a source or gate wire of each TFT (a contact terminal 654 connected to the source wire in FIG. 11) is formed. The contact terminal is connected to an FPC (flexible printed circuit) 655 to become an input terminal with an anisotropic conductive film 656 interposed therebetween, and receives a video signal or a clock signal through the anisotropic conductive film 656.

In the driver circuit portion 644, a circuit for driving a pixel, such as a source driver or a gate driver is formed. Here, an N-channel TFT 651 formed similarly to the switching TFT 602 in the pixel portion and a P-channel TFT 652 formed similarly to the driver TFT 603 in the pixel portion are arranged. It is to be noted that the N-channel TFT 651 and the P-channel TFT form a CMOS circuit.

In the pixel portion 645, pixels (a region 610 in FIG. 7A) including the switching TFT 602, the driver TFT 603, and the light-emitting element 624 are arranged in matrix.

A protective layer may be formed over the light-emitting element 624 of the pixel portion and the insulating layer 621. The protective layer is formed to prevent intrusion of moisture, oxygen, and the like into the light-emitting element 624 and the insulating layer 621. The protective layer is preferably formed by a thin film forming method such as a plasma CVD method or a sputtering method, with an insulating material such as silicon nitride, silicon oxide, silicon nitride oxide, silicon oxynitride, aluminum oxynitride, aluminum oxide, diamond-like carbon (DLC), or carbon containing nitrogen (CN).

In this embodiment, since a source driver, a gate driver, and a TFT of a pixel portion are formed over one substrate, a light-emission display panel can be thinned.

A space may be provided in a region 642 between the second substrate 640 and the protective layer 653, which is filled with inert gas such as nitrogen gas. This can suppress the intrusion of moisture or oxygen into the light-emitting element and the insulating layer 621.

The second substrate 640 may be provided with a colored layer. In this case, a light-emitting element capable of white light emission is provided for each pixel and a colored layer for expressing R, G, or B is provided separately, thereby allowing full-color display. Moreover, when a light-emitting element capable of blue light emission is provided for each pixel and a color conversion layer is provided separately, full-color display can be achieved. Such an EL display module has high color purity of RGB and allows high-definition display. Moreover, a light-emitting element expressing red, green, or blue light emission can be formed for each pixel and a colored layer can also be used.

Further, in the case where light from the light-emitting element 624 is emitted to a first substrate 600 side, a surface of the first substrate 600 may be provided with a polarizing plate and a wave plate. Meanwhile, in the case where light from the light-emitting element 624 is emitted to a second substrate 640 side, a surface of the second substrate 640 may be provided with a polarizing plate and a wave plate. Furthermore, in the case where light from the light-emitting element 624 is emitted to both of the first substrate 600 side and the second substrate 624 side, surfaces of the first substrate 600 and the second substrate 640 may be provided with polarizing plates and wave plates.

Either one or both of the first substrate 600 and the second substrate 640 may be a film substrate, a resin substrate, or the like, thereby forming a light-emitting display panel. By sealing without using a counter substrate in this way, a display device can be lightweight, compact, and thin further.

By connecting the light-emitting display panel to an external circuit such as a power source circuit or a controller, a light-emitting display module can be formed.

Embodiment 2

Figure 12:
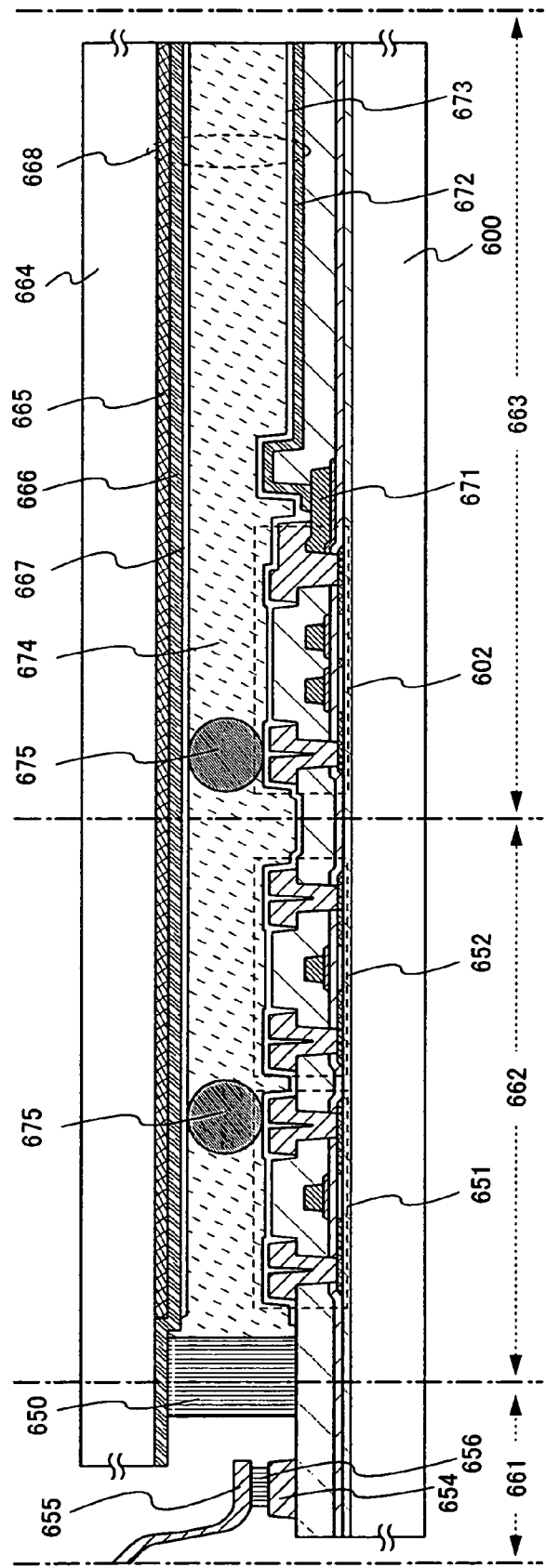
FIG. 12 is a cross-sectional view showing a semiconductor device of the present invention.

This embodiment will describe a liquid crystal display panel with reference to FIG. 12. In the liquid crystal display panel, the first substrate 600, a second substrate 664, and a liquid crystal layer 674 are sealed by a sealing material 650. The sealing material 650 preferably contains a holding material for holding the distance between the substrates, typified by filler.

A driver circuit portion 662 and a pixel portion 663 are formed in such a way that they are surrounded by the sealing material 650, the first substrate 600, and the second substrate 664. A terminal portion 661 is formed outside the sealing material 650.

Over the second substrate 664, a colored layer 665 functioning as a color filter or black matrix, a second pixel electrode 666, and an insulating layer 667 functioning as an orientation film are formed. Although not shown, one or both of the first substrate 600 and the second substrate 664 is/are provided with a polarizing plate.

At the terminal portion 661, a contact terminal connected to a source wire and a gate wire of each TFT is formed similarly to the terminal portion 643 shown in Embodiment 1 (a contact terminal 654 connected to the gate wire is shown in FIG. 12). The contact terminal is connected to the FPC (flexible printed circuit) to become an input terminal with an anisotropic conductive film 656 interposed therebetween and receives a video signal or a clock signal through the anisotropic conductive film 656.

In the driver circuit portion 662, a circuit for driving a pixel, such as a source driver or a gate driver is formed similarly to the driver circuit portion 644 shown in Embodiment 1. Here, an N-channel TFT 651 and a P-channel TFT 652 are arranged. It is to be noted that the N-channel TFT 651 and the P-channel TFT 652 form a CMOS circuit.

A plurality of pixels are formed in the pixel portion 663 and a liquid crystal element 668 is formed in each pixel. The liquid crystal element 668 is a portion where a first pixel electrode 672, the second pixel electrode 666, and the liquid crystal layer 674 filled therebetween overlap with each other. The first pixel electrode 672 in the liquid crystal element 668 is electrically connected to the TFT 602 with a contact conductive layer 671 interposed therebetween. The second pixel electrode 666 of the liquid crystal element 668 is formed on a second substrate 664 side. Moreover, an insulating layer 673 functioning as an orientation film is formed between the first pixel electrode 672 and the liquid crystal layer 674. An insulating layer 667 functioning as an orientation film is formed between the second pixel electrode 666 and the liquid crystal layer 674.

It is preferable that the first substrate 600 and the second substrate 664 be kept apart with a fixed distance therebetween in order to decrease display unevenness. Therefore, spacers 675, which are a gap-maintaining material, are distributed between the first substrate 600 and the second substrate 664. Here, although the spacers 675 are spherical spacers, the shape is not limited to this and pillar spacers are also applicable.

Embodiment 3

Figure 13A:
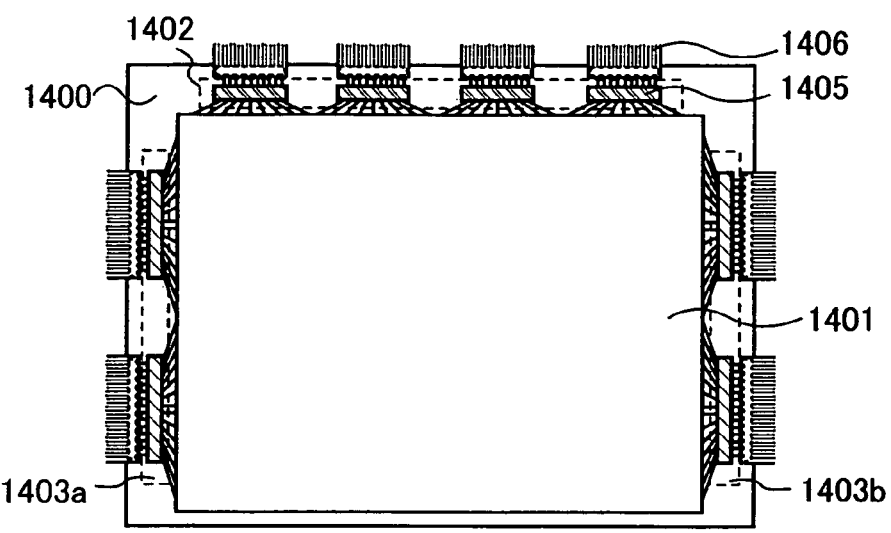
FIGS. 13A to 13C are top views showing a semiconductor device of the present invention.
Figure 13B:
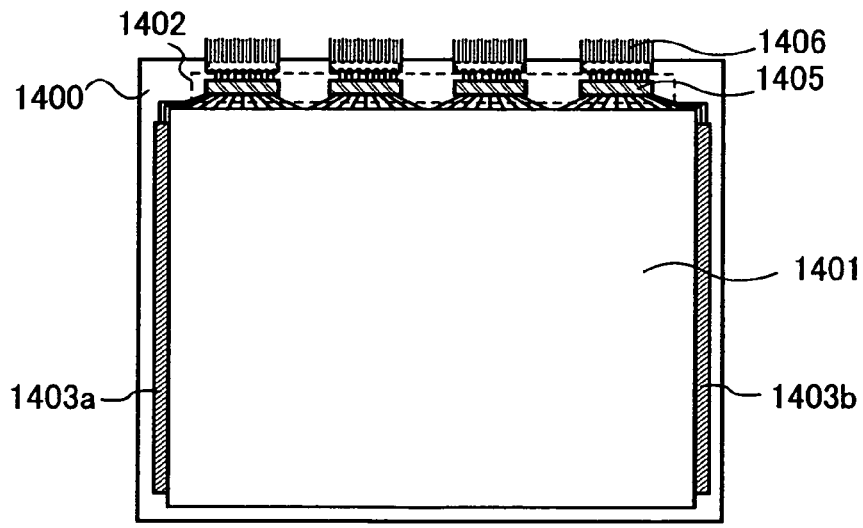
Figure 13C:
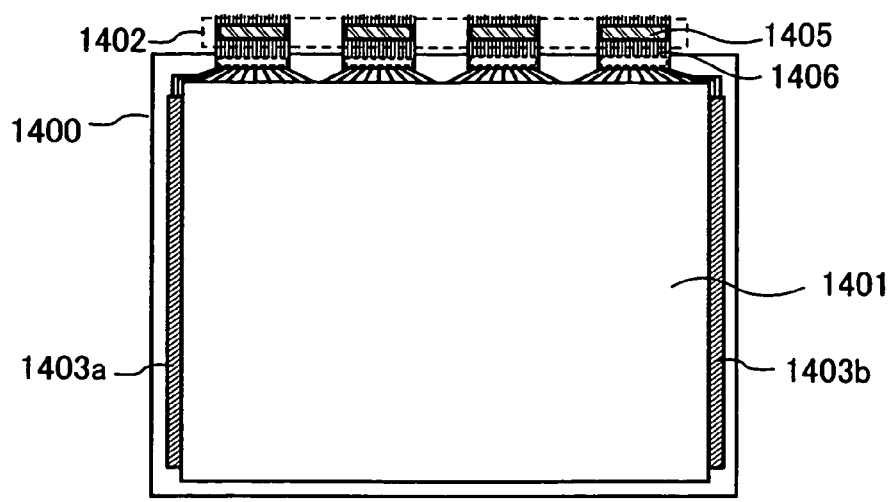

This embodiment will describe mounting of a driver circuit on a display panel shown in the above embodiment, with reference to FIGS. 13A to 13C.

As shown in FIG. 13A, a source driver 1402 and gate drivers 1403a and 1403b are mounted around a pixel portion 1401. In FIG. 13A, the source driver 1402, the gate drivers 1403a and 1403b, and the like are mounted on a substrate 1400 with the use of IC chips 1405 by a mounting method using an anisotropic conductive adhesive and an anisotropic conductive film, a COG method, a wire bonding method, a reflow process using solder bump, or the like. Here, a COG method is used. Then, the IC chip is connected to an external circuit through an FPC (flexible printed circuit) 1406.

A part of the source driver 1402, for example an analog switch, may be formed integrally over the substrate and the other parts may be mounted separately by IC chips.

In the case of forming a TFT with an SAS or a crystalline semiconductor, sometimes, the pixel portion 1401, the gate drivers 1403a and 1403b, and the like are formed integrally over a substrate and the source driver 1402 and the like are be mounted separately by using IC chips as shown in FIG. 13B. The source driver 1402 is mounted on the substrate 1400 using the IC chip 1405 by a COG method in FIG. 13B. Then, the IC chip is connected to an external circuit through the FPC 1406.

A part of the source driver 1402, for example an analog switch, may be formed integrally over the substrate and the other parts may be mounted separately by using IC chips.

Further, as shown in FIG. 13C, in some cases, the source driver 1402 and the like are mounted by a TAB method instead of a COG method. Then, the IC chips are connected to external circuits through the FPC 1406. Although the source driver is mounted by a TAB method in FIG. 13C, the gate driver may be mounted by a TAB method.

The mounting of IC chips by a TAB method allows a pixel portion to be enlarged with respect to a substrate and achieves narrower frames.

Although an IC chip is formed by using a silicon wafer, an IC (hereinafter referred to as a driver IC) in which a circuit is formed over a glass substrate may be used instead of the IC chip. Since IC chips are taken out from a circular silicon wafer, the shape of a mother substrate is restricted. On the other hand, a driver IC is made of glass as a mother substrate and its shape is not restricted; therefore, the productivity can be increased. Thus, the shape and size of the driver IC can be freely set. For example, in a driver IC having a length of 15 to 80 mm on a long side, the number of driver ICs can be decreased as compared with the IC chip. Accordingly, the number of contact terminals can be reduced to increase yield on production.

The driver IC can be formed with a crystalline semiconductor formed over a substrate, and the crystalline semiconductor may be obtained by continuous wave laser irradiation. A semiconductor film obtained by continuous wave laser irradiation has few crystal defects and has crystal grains with large size. Thus, a transistor having such a semiconductor film has high mobility and response speed; therefore, high-speed operation becomes possible, which is preferable for a driver IC.

Embodiment 4

Figure 14:
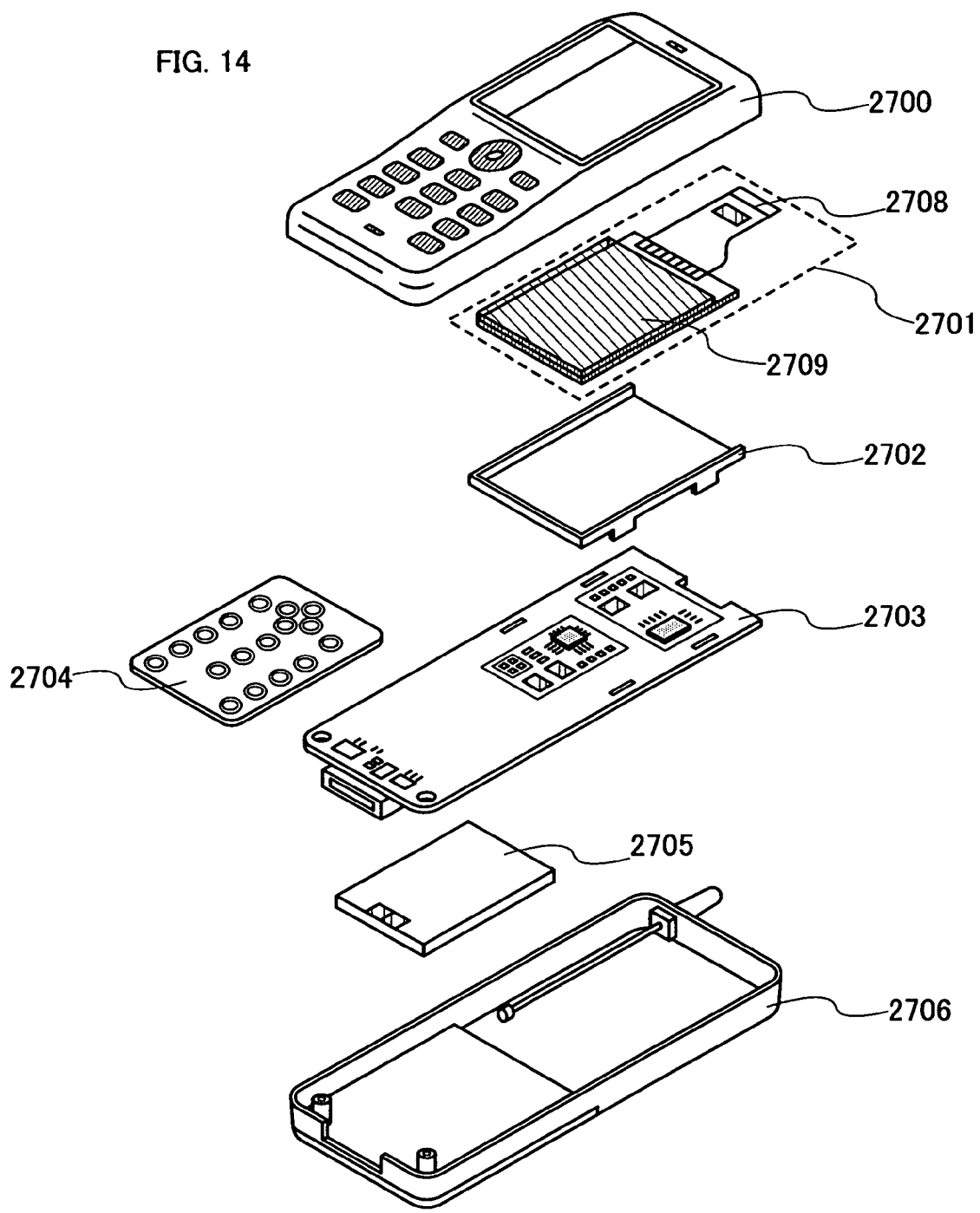
FIG. 14 is a perspective view showing a semiconductor device of the present invention.

An aspect of an electronic appliance with a semiconductor device of the present invention mounted will be described with reference to a drawing. An electronic appliance to be described here is a mobile phone, which includes cases 2700 and 2706, a panel 2701, a housing 2702, a print wiring substrate 2703, operation buttons 2704, and a battery 2705 (see FIG. 14). The panel 2701 is detachably incorporated into the housing 2702, and the housing 2702 is fitted into the print wiring substrate 2703. The shape and size of the housing 2702 is appropriately modified in accordance with an electronic appliance to which the panel 2701 is to be incorporated. The print wiring substrate 2703 has a plurality of packaged semiconductor devices mounted. A semiconductor device of the present invention can be used as one of the packaged semiconductor devices. The plurality of semiconductor devices mounted on the print wiring substrate 2703 has any function of a controller, a central processing unit (CPU), a memory, a power source circuit, an audio processing circuit, a sending/receiving circuit, and the like.

The panel 2701 is connected to the print wiring substrate 2703 through a contact film 2708. The panel 2701, the housing 2702, and the print wiring substrate 2703 are included inside the cases 2700 and 2706 together with the operation buttons 2704 and the battery 2705. A pixel region 2709 in the panel 2701 is provided so as to be observed from an opening window provided in the case 2700.

As aforementioned, the semiconductor device of the present invention has advantages of its compactness, thinness, and lightweight. These advantages allow efficient usage of limited space in the cases 2700 and 2706 of the electronic appliance. Further, cost reduction is possible and an electronic appliance having a highly-reliable semiconductor device can be manufactured.

Embodiment 5

Electronic appliances having the semiconductor devices shown in the embodiment modes and embodiments include a television device (also called a TV simply or a television receiving device), a camera such as a digital camera or a digital video camera, a mobile telephone device (also referred to as a cellular phone device or a cellular phone, simply), a mobile information terminal such as a PDA, a mobile game machine, a monitor for a computer, a computer, an audio reproducing device such as a car audio component, an image reproducing device equipped with a recording medium, such as a home-use game machine, and the like. The specific examples are described with reference to FIGS. 15A to 15F.

Figure 15A:
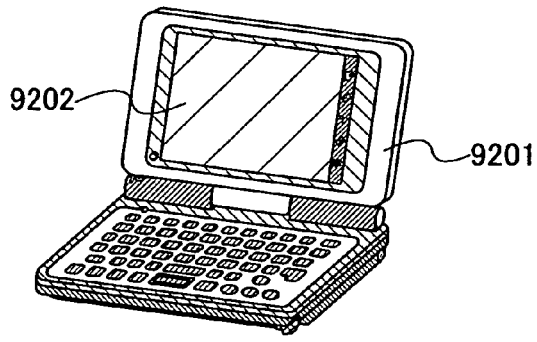
FIGS. 15A to 15F are perspective views showing semiconductor devices of the present invention.

A mobile information terminal shown in FIG. 15A includes a main body 9201, a display portion 9202, and the like. The display portion 9202 can have the semiconductor device shown in any of Embodiment Modes 1 to 5 and Embodiments 1 to 4. By using a display device according to an aspect of the present invention, an inexpensive and highly-reliable mobile information terminal can be provided.

Figure 15B:
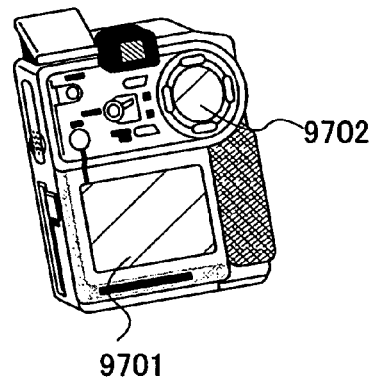

A digital video camera shown in FIG. 15B includes a display portion 9701, a display portion 9702, and the like. The display portion 9701 can have the semiconductor device shown in any of Embodiment Modes 1 to 5 and Embodiments 1 to 4. By using a display device according to an aspect of the present invention, an inexpensive and highly-reliable video camera can be provided.

Figure 15C:
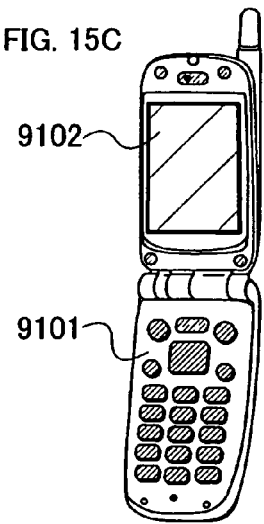

A mobile terminal shown in FIG. 15C includes a main body 9101, a display portion 9102, and the like. The display portion 9102 can have the semiconductor device shown in any of Embodiment Modes 1 to 5 and Embodiments 1 to 4. By using a display device according to an aspect of the present invention, an inexpensive and highly-reliable mobile terminal can be provided.

Figure 15D:
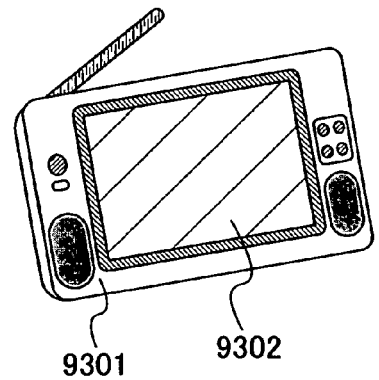

A mobile television device shown in FIG. 15D includes a main body 9301, a display portion 9302, and the like. The display portion 9302 can have the semiconductor device shown in any of Embodiment Modes 1 to 5 and Embodiments 1 to 4. By using a display device according to an aspect of the present invention, an inexpensive and highly-reliable mobile television device can be provided. Such a television device can be widely applied within the range of a small size which is mounted in a mobile terminal such as a mobile phone to a middle size which is portable, and even applied to a large size (for example 40 inches or larger).

Figure 15E:
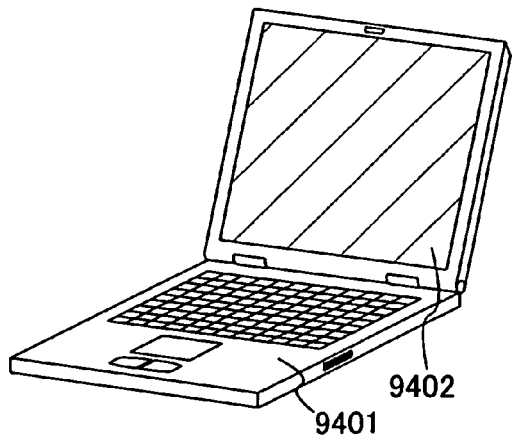

A mobile computer shown in FIG. 15E includes a main body 9401, a display portion 9402, and the like. The display portion 9402 can have the semiconductor device shown in any of Embodiment Modes 1 to 5 and Embodiments 1 to 4. By using a display device according to an aspect of the present invention, an inexpensive and highly-reliable mobile computer can be provided.

Figure 15F:
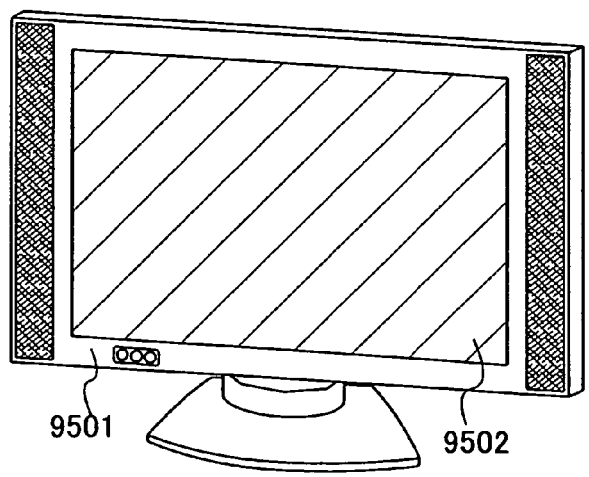

A television device shown in FIG. 15F includes a main body 9501, a display portion 9502, and the like. The display portion 9502 can have the semiconductor device shown in any of Embodiment Modes 1 to 5 and Embodiments 1 to 4. By using a display device according to an aspect of the present invention, an inexpensive and highly-reliable television device can be provided.

Embodiment 6

With reference to FIGS. 21A to 22D, this embodiment will describe an observation result by FIB (Focused Ion Beam system) of a structure at a contact portion between a pixel electrode and a semiconductor region and a contact portion between a gate electrode and a drain wire in a conventional thin film transistor and a thin film transistor of the present invention.

Figure 21A:
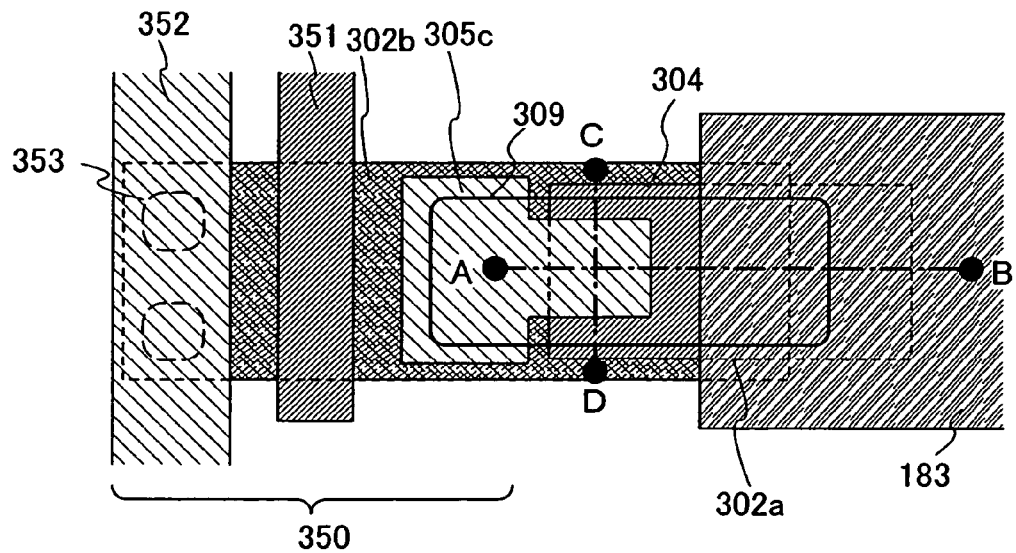
FIGS. 21A to 21C are top views showing a semiconductor device of the present invention and semiconductor devices of a conventional example.
Figure 22A:
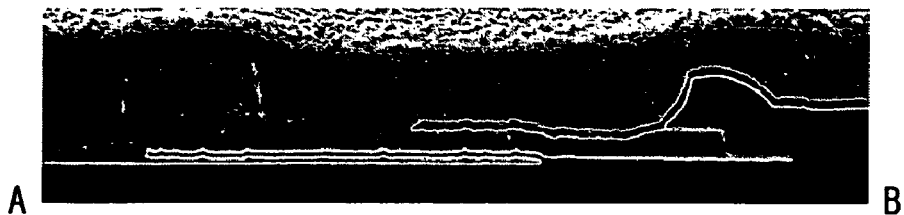
FIGS. 22A to 22D are cross-sectional views showing a semiconductor device of the present invention.
Figure 22B:
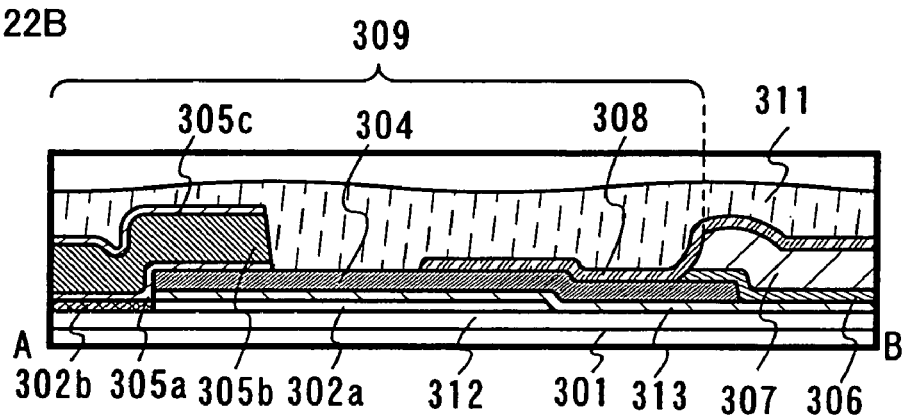
Figure 22C:
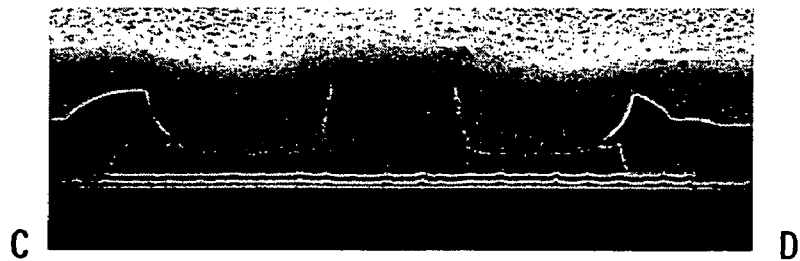
Figure 22D:
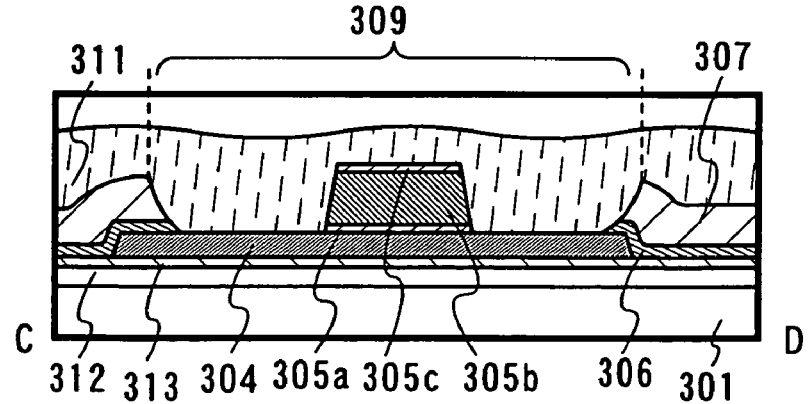

FIG. 21A is a top view of a pixel electrode and a drain electrode of a thin film transistor of the present invention. FIG. 22A shows an image observed by FIB at a cross section along a line A-B of FIG. 21A. FIG. 22B is a schematic view of FIG. 22A. Moreover, FIG. 22C shows an image observed by FIB at a cross section along a line C-D of FIG. 21A while FIG. 22D is a schematic view of FIG. 22C. It is to be noted that observation by FIB is carried out obliquely (with a tilt angle of 60°).

As shown in FIG. 21A and FIGS. 22B and 22D, a thin film transistor 350 formed over a substrate 301 includes semiconductor regions 302a and 302b, a gate insulating layer 313, a gate electrode 351, a source electrode 352, and drain electrodes 305a to 305c. Moreover, the source electrode 352 and the drain electrodes 305a to 305c and the gate electrode 351 are insulated by interlayer insulating layers 306 and 307. The source electrode 352, the drain electrodes 305a to 305c, and the contact conductive layer 304 are insulated by the interlayer insulating layers 306 and 307. The semiconductor region 302b is connected to the source electrode 352 through a contact hole 353. The thin film transistor 350 is formed over the substrate 301 with the insulating layer 312 interposed therebetween.

A contact conductive layer 304 formed at the same time as the gate electrode 351 overlaps with the semiconductor region 302a with the gate insulating layer 313 interposed therebetween. Moreover, the contact conductive layer 304 is connected to the drain electrodes 305a to 305c in a contact hole 309. Similarly, the contact conductive layer 304 is connected to the pixel electrode 308 in the contact hole 309. End portions of the drain electrodes 305a to 305c of the thin film transistor 350 of the present invention are located inside the contact hole 309. The semiconductor region 302b is connected to the pixel electrode 308 with the drain electrodes 305a to 305c and the contact conductive layer 304 interposed therebetween.

An insulating layer 311 is formed by a coating method over the source electrode 352, the drain electrodes 305a to 305c, the contact conductive layer 304, the pixel electrode 308, and the interlayer insulating layer 307.

Here, a glass substrate is used as the substrate 301, and a 140-nm-thick silicon nitride oxide film and a 100-nm-thick silicon oxynitride film are stacked in order by a CVD method, thereby forming the insulating layer 312. As the semiconductor regions 302a and 302b, a crystalline silicon layer is formed in 50 nm thick. As the gate insulating layer 313, a silicon oxide layer is formed in 110 nm thick by a CVD method using tetraethyl ortho silicate (TEOS) and $O_2$ as a material. As the gate electrode 351 and the contact conductive layer 304, a tantalum nitride layer of 30 nm thick and a tungsten layer of 370 nm thick are formed by a sputtering method. As the drain electrodes 305a to 305c, a titanium layer of 100 nm thick, an aluminum layer of 700 nm thick, and a titanium layer of 100 nm thick are stacked in order by a sputtering method. The source electrode 352, although not shown in FIG. 21A, is formed by stacking layers similarly to the drain electrodes 305a to 305c. A silicon nitride oxide layer is formed in 140 nm thick as the interlayer insulating layer 306 and a silicon oxynitride layer is formed in 670 nm thick as the interlayer insulating layer 307, by a CVD method. ITO containing silicon oxide is formed in 125 nm thick as the pixel electrode 308 by a sputtering method.

FIGS. 22C and 22D are cross-sectional views in a direction intersecting with that shown in FIGS. 22A and 22B. As shown in FIGS. 22C and 22D, the end portions of the drain electrodes 305a to 305c that are connected to the contact conductive layer 304 are located inside the contact hole 309.

Figure 21B:
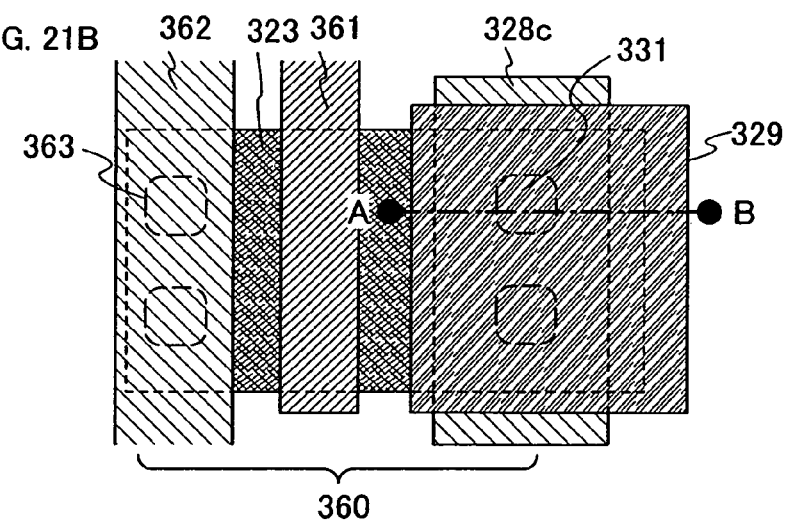
Figure 21C:
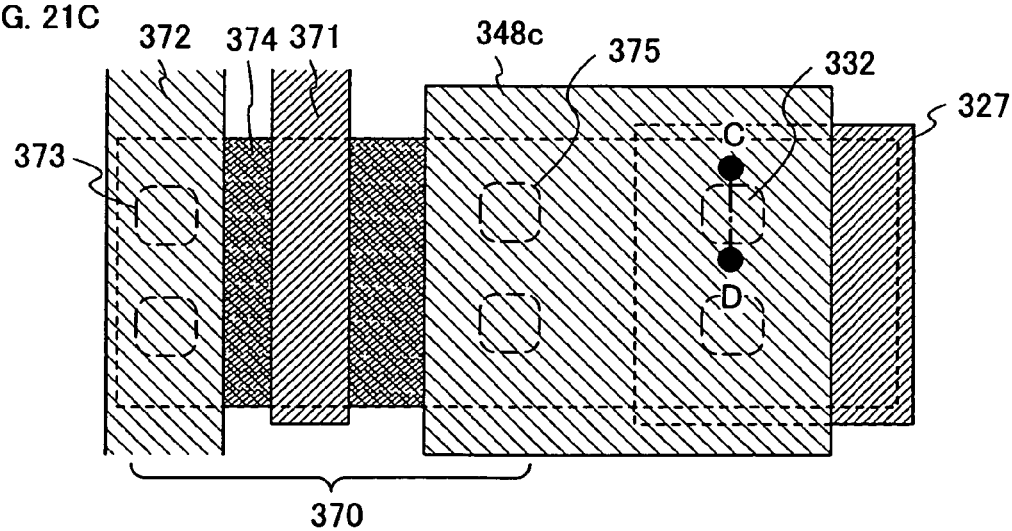
Figure 23A:
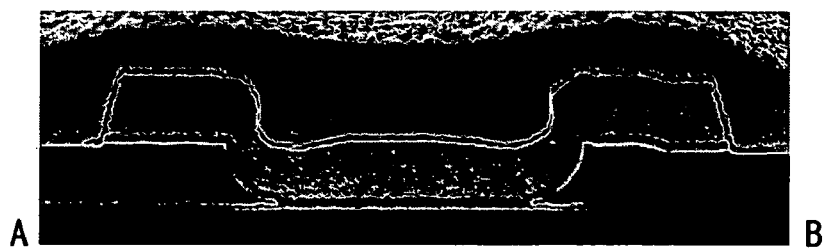
FIGS. 23A to 23D are cross-sectional views showing a conventional semiconductor device.
Figure 23B:
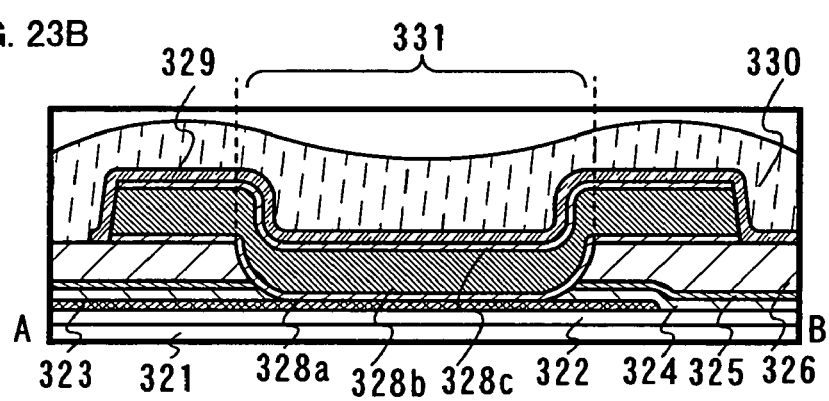
Figure 23C:
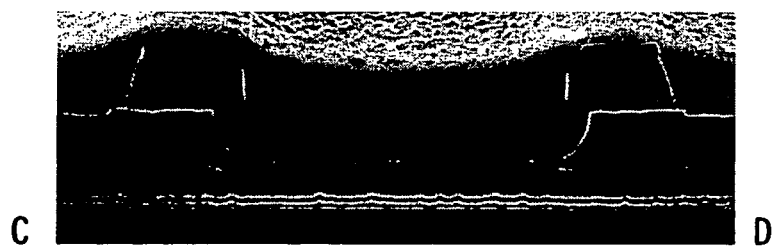
Figure 23D:
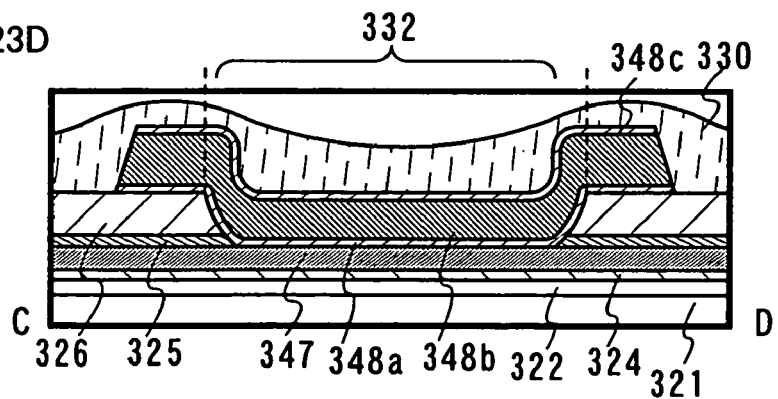

FIG. 21B is a top view of a contact portion between a pixel electrode and a drain electrode of a conventional thin film transistor. FIG. 21C is a top view of a contact portion between a contact conductive layer and a drain electrode of the thin film transistor. FIG. 23A shows an image observed by FIB at a cross section along a line A-B of FIG. 21B, while FIG. 23B is a schematic view of FIG. 23A. FIG. 23C shows an image observed by FIB at a cross section along a line C-D of FIG. 21C, while FIG. 23D is a schematic view of FIG. 23C.

As shown in FIGS. 21B and 23B, a thin film transistor 360 formed over a substrate 321 includes a semiconductor region 323, a gate insulating layer 324, a gate electrode 361, a source electrode 362, and drain electrodes 328a to 328c. The source electrode 362, the drain electrodes 328a to 328c, and the gate electrode 361 are insulated by interlayer insulating layers 325 and 326. In the contact hole 363, the semiconductor region 323 is connected to the source electrode 362. The thin film transistor 360 is formed over the substrate 321 with an insulating layer 322 interposed therebetween.

In a contact hole 331, the semiconductor region 323 is connected to the drain electrodes 328a to 328c. A pixel electrode 329 is formed over a part of the interlayer insulating layer 326 and the drain electrode 328c, and the drain electrode 328c is connected to the pixel electrode 329. End portions of the drain electrodes 328a to 328c of the conventional thin film transistor 360 are not located inside the contact hole 331 but are formed over the interlayer insulating layer 326. The semiconductor region 323 is connected to the pixel electrode 329 with the drain electrodes 328a to 328c interposed therebetween.

An insulating layer 330 is formed by a coating method over the interlayer insulating layer 326 and the pixel electrode 329.

Next, a drawing corresponding to a cross-sectional view taken along a line C-D of FIG. 21C is shown in FIGS. 23C and 23D.

As shown in FIGS. 21C and 23D, the thin film transistor 370 formed over the substrate 321 includes a semiconductor region 374, a gate insulating layer 324, a gate electrode 371, a source electrode 372, and drain electrodes 348a to 348c, similarly to the thin film transistor 360. The source electrode 372, the drain electrodes 348a to 348c, and the gate electrode 371 are insulated by the interlayer insulating layers 325 and 326. In the contact hole 373, the semiconductor region 374 is connected to the source electrode 372. The thin film transistor 370 is formed over the substrate 301 with the insulating layer 322 interposed therebetween.

In the contact hole 375, the semiconductor region 374 is connected to the drain electrodes 348a to 348c. The conductive layer 327 formed at the same time as the gate electrode 371 is connected to the drain electrodes 348a to 348c in a contact hole 332. End portions of the drain electrodes 348a to 348c of the conventional thin film transistor 370 are not located inside the contact hole 332 but are formed over the interlayer insulating layer 326.

Here, a glass substrate is used as the substrate 321, and a 140-nm-thick silicon nitride oxide film and a 100-nm-thick silicon oxynitride film are stacked in order by a CVD method, thereby forming the insulating layer 322. As the semiconductor region 323, a crystalline silicon layer is formed in 50 nm thick. As the gate insulating layer 324, a silicon oxide layer is formed in 110 nm thick by a CVD method using tetraethyl ortho silicate (TEOS) and $O_2$ as a material. As the gate electrodes 361 and 371, a tantalum nitride layer of 30 nm thick and a tungsten layer of 370 nm thick are formed by a sputtering method. As the drain electrodes 328a to 328c and 348a to 348c, a titanium layer of 100 nm thick, an aluminum layer of 700 nm thick, and a titanium layer of 100 nm thick are stacked in order by a sputtering method. The source electrodes 362 and 372, although not shown in FIGS. 21B and 21C, are formed by stacking layers similarly to the drain electrodes 328a to 328c and 348a to 348c. A silicon nitride oxide layer is formed in 140 nm thick as an interlayer insulating layer 325 and a silicon oxynitride layer is formed in 670 nm thick as an interlayer insulating layer 326, by a CVD method. ITO containing silicon oxide is formed in 125 nm thick as the pixel electrode 329 by a sputtering method.

When FIGS. 22A to 22D are compared with FIGS. 23A to 23D, it is understood that the insulating layer 311 of the thin film transistor 350 of the present invention has less depression and projection difference than the insulating layer 330 of the conventional thin film transistors 360 and 370. Thus, an insulating layer with superior flatness can be formed by a coating method. In the case of forming the insulating layer, a material can be reduced. This allows cost reduction as well as increased productivity.

This application is based on Japanese Patent Application serial no. 2005-189020 filed in Japan Patent Office on Jun. 28, in 2005 and Japanese Patent Application serial no. 2005-379975 filed in Japan Patent Office on Dec. 28, in 2005, the entire contents of which are hereby incorporated by reference.

What is claimed is:

1. A semiconductor device comprising:
   a first conductive layer;
   an insulating layer over the first conductive layer, the insulating layer including first and second contact holes;
   a second conductive layer over the insulating layer and in the first contact hole; and
   a pixel electrode over the insulating layer and in the second contact hole,
   wherein the second conductive layer is in contact with both a top surface and a side surface of the first conductive layer in the first contact hole,
   wherein the pixel electrode is in contact with the first conductive layer in the second contact hole, and
   wherein the pixel electrode is electrically connected to the second conductive layer via the first conductive layer.

2. A semiconductor device according to claim 1,
   wherein the second conductive layer partially overlaps with the first conductive layer.

3. A semiconductor device comprising:
   a semiconductor layer;
   a gate electrode with a gate insulating layer interposed between the semiconductor layer and the gate electrode;
   an insulating layer over the gate electrode, the insulating layer including first, second, and third contact holes;
   a first conductive layer;
   a second conductive layer over the insulating layer and in the first contact hole; and
   a pixel electrode over the insulating layer and in the third contact hole,
   wherein the second conductive layer is in contact with the semiconductor layer in the first contact hole, and the first conductive layer in the second contact hole, and
   wherein the pixel electrode is in contact with the first conductive layer in the third contact hole.

4. A semiconductor device according to claim 3,
   wherein the second conductive layer partially overlaps with the first conductive layer.

5. A semiconductor device comprising:
   a semiconductor layer;
   a gate electrode with a gate insulating layer interposed between the semiconductor layer and the gate electrode;
   an insulating layer over the gate electrode, the insulating layer including first and second contact holes;
   a first conductive layer;
   a second conductive layer over the insulating layer and in the first contact hole; and
   a pixel electrode over the insulating layer and in the second contact hole,
   wherein the second conductive layer is electrically connected to the semiconductor layer and is in contact with the first conductive layer in the first contact hole,
   wherein the pixel electrode is in contact with the first conductive layer in the second contact hole.

6. A semiconductor device according to claim 5,
   wherein the second conductive layer partially overlaps with the first conductive layer.

* * * * *